US011676843B2

(12) United States Patent
Müssig et al.

(10) Patent No.: US 11,676,843 B2
(45) Date of Patent: Jun. 13, 2023

(54) SYSTEM AND METHOD FOR CONNECTING ELECTRONIC ASSEMBLIES

(71) Applicant: PINK GmbH Thermosysteme, Wertheim (DE)

(72) Inventors: Stefan Müssig, Dorfprozelten (DE); Christoph Oetzel, Wertheim (DE)

(73) Assignee: PINK GMBH THERMOSYSTEME, Wertheim (DE)

( * ) Notice: Subject to any disclaimer, the term of this patent is extended or adjusted under 35 U.S.C. 154(b) by 0 days.

(21) Appl. No.: 17/642,533

(22) PCT Filed: Oct. 2, 2020

(86) PCT No.: PCT/EP2020/077683
§ 371 (c)(1),
(2) Date: Mar. 11, 2022

(87) PCT Pub. No.: WO2021/069328
PCT Pub. Date: Apr. 15, 2021

(65) Prior Publication Data
US 2022/0344178 A1    Oct. 27, 2022

(30) Foreign Application Priority Data

Oct. 7, 2019 (DE) .......................... 202019105520.0
Dec. 13, 2019 (DE) .......................... 102019134410.7

(51) Int. Cl.
*H01L 21/677* (2006.01)
*H01L 21/67* (2006.01)
*H05K 3/34* (2006.01)

(52) U.S. Cl.
CPC .... *H01L 21/6776* (2013.01); *H01L 21/67132* (2013.01); *H01L 21/67173* (2013.01);
(Continued)

(58) Field of Classification Search
CPC .......... H01L 21/6776; H01L 21/67132; H01L 21/67173; H01L 21/67196;
(Continued)

(56) References Cited

U.S. PATENT DOCUMENTS 3,973,322 A * 8/1976 Boynton ............ H05K 13/0465
228/180.1
6,086,699 A * 7/2000 Nakashima ......... H01L 21/6715
156/247

(Continued)

FOREIGN PATENT DOCUMENTS

DE          3414065 A1    12/1985
DE         10039201 A1     2/2002
(Continued)

OTHER PUBLICATIONS

International Search Report dated Dec. 8, 2020; International Application PCT/EP2020/077683.
(Continued)

*Primary Examiner* — Dale E Page
*Assistant Examiner* — Quovaunda Jefferson
(74) *Attorney, Agent, or Firm* — Dinsmore & Shohl LLP

(57) ABSTRACT

A method and system for connecting electronic assemblies and/or for manufacturing workpieces, having a plurality of modules for connecting the electronic assemblies, includes at least one module configured as a loading station and/or unloading station. At least one further module is configured as a manufacturing station. A manufacturing workpiece carrier is provided for accommodating the electronic assemblies and/or the workpieces, and is movable in automated manner by way of a conveying unit from the loading station via the manufacturing station to the unloading station. The system is configured in particular for assembly line production. In a secondary aspect, a foil/film transfer unit is
(Continued)

proposed which provides automated application of foils/films as a process cover in the loading station.

33 Claims, 13 Drawing Sheets

(52) U.S. Cl.
CPC .. *H01L 21/67196* (2013.01); *H01L 21/67742* (2013.01); *H05K 3/34* (2013.01)

(58) Field of Classification Search
CPC ......... H01L 21/67742; H01L 21/67346; H01L 24/75; H01L 2224/7501; H01L 2224/7525; H01L 2224/755; H01L 2224/75651; H05K 3/34
See application file for complete search history.

(56) References Cited

U.S. PATENT DOCUMENTS

| | | | | |
|---|---|---|---|---|
| 2004/0206307 | A1* | 10/2004 | Boroson | H01L 21/67161 427/457 |
| 2008/0233283 | A1* | 9/2008 | Choi | H01L 21/67748 427/226 |
| 2009/0056878 | A1 | 3/2009 | Nozawa et al. | |
| 2010/0003768 | A1 | 1/2010 | Barnes et al. | |
| 2015/0118855 | A1 | 4/2015 | Wagner et al. | |

FOREIGN PATENT DOCUMENTS

| | | |
|---|---|---|
| DE | 102004019567 B3 | 1/2006 |
| DE | 20122579 U1 | 6/2006 |
| DE | 102009022660 B3 | 9/2010 |
| DE | 102014106631 A1 | 11/2014 |
| DE | 102014114093 B4 | 3/2017 |
| EP | 3026702 A1 | 6/2016 |
| WO | 2009150239 A1 | 12/2009 |
| WO | 2016187010 A1 | 11/2016 |

OTHER PUBLICATIONS

Matz, W., A two magnetron sputter deposition chamber for in situ observation of thin film growth by synchrotron radiation scattering; 2001 American Institute of Physics; vol. 72, No. 8, Aug. 2001.

* cited by examiner

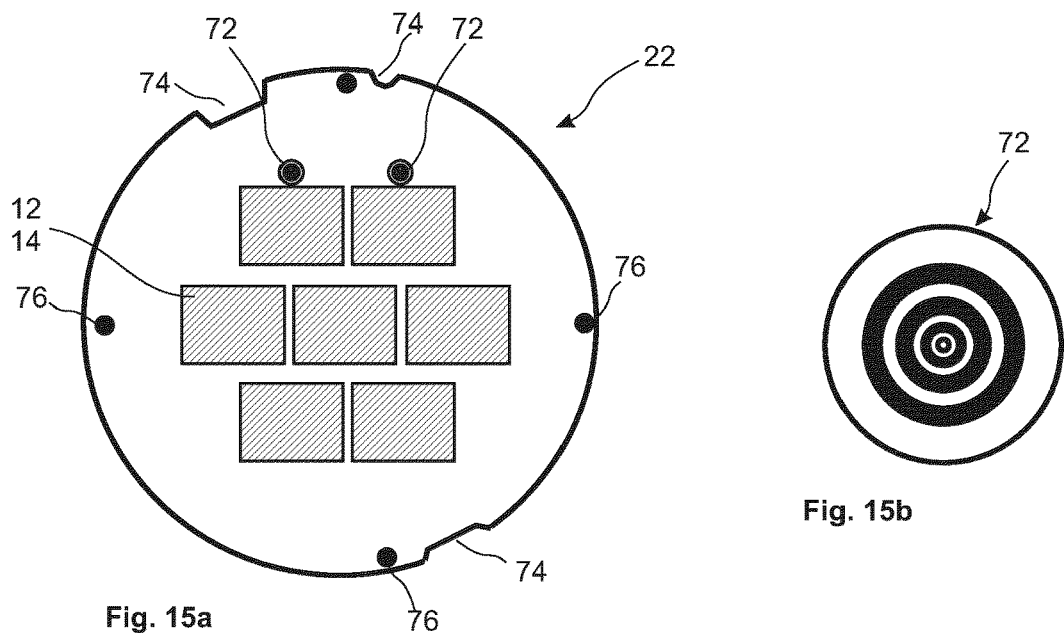
Fig. 15a
Fig. 15b
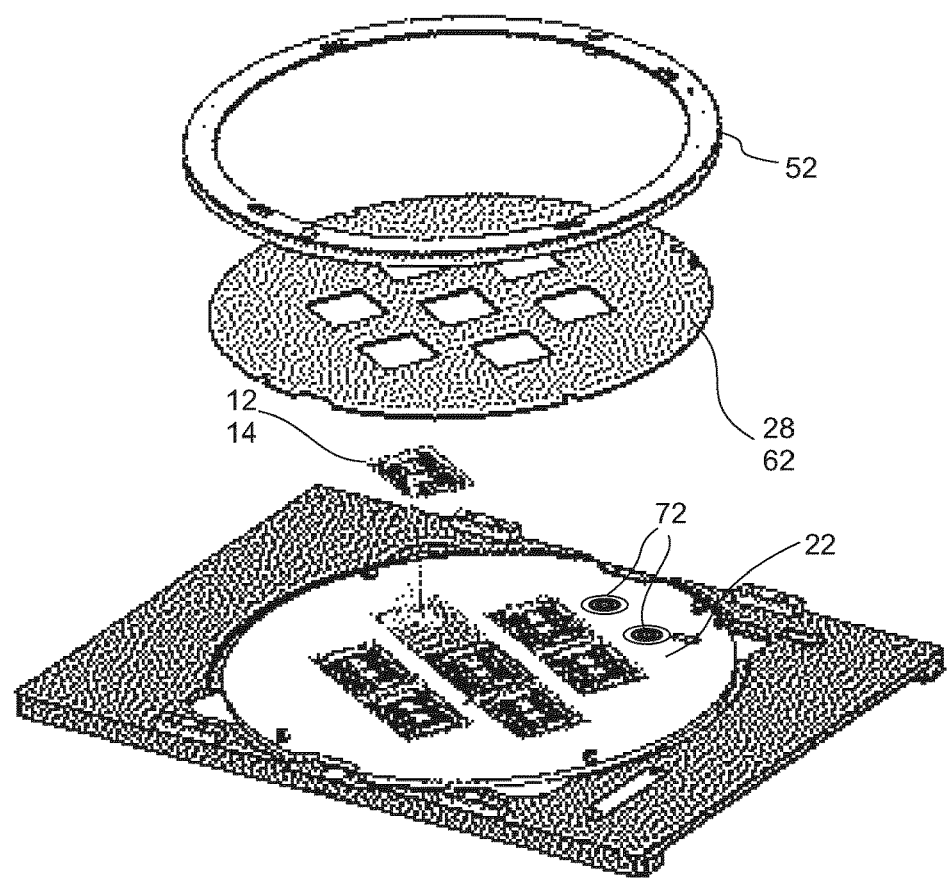
Fig. 16

SYSTEM AND METHOD FOR CONNECTING ELECTRONIC ASSEMBLIES

CROSS-REFERENCE TO RELATED APPLICATIONS

This application is the U.S. National Stage of PCT/EP2020/077683 filed on Oct. 2, 2020, which claims priority to German Patent Application 202019105520.0 filed on Oct. 7, 2019, and German Patent Application 102019134410.7 filed on Dec. 13, 2019 the entire content of both are incorporated herein by reference in their entirety.

FIELD OF THE INVENTION

The invention relates to a system for connecting electronic assemblies and/or for manufacturing workpieces, in particular a sintering or soldering system. The invention likewise relates to a foil/film transfer unit, which provides cover foils/films for covering the workpieces in the system.

The invention further relates to a method for connecting electronic assemblies and/or for manufacturing workpieces, in particular for a sintering or soldering system.

BACKGROUND OF THE INVENTION

The prior art discloses systems and methods for connecting electronic assemblies, in particular soldering and sintering systems with a process atmosphere, in particular vacuum or gas atmosphere, which are designed as individual systems and not for continuous manufacture. In this case, undesired idle times arise between the individual method steps or the individual positions of the system, during which idle times individual fabrication operations, such as moving workpieces onto a conveying unit or covering the workpieces with a process cover, have to be performed manually. Therefore, prior art systems for connecting electronic assemblies are known which do not operate in a fully automated manner. In such known systems or methods, individual working steps are carried out manually and require manual intervention. In this situation, errors may arise during workpiece fabrication.

Interruption of the individual steps or interruptions between the individual positions mean that a clean room, in particular an ISO 5 clean room, cannot always be provided.

A clean or ultra-clean room is a room in which the concentration of air-borne particles is kept very low. Clean and ultra-clean rooms are required for specific manufacturing procedures (primarily in semiconductor manufacture) where particles present in ordinary ambient air would disrupt the patterning of integrated circuits within the range of fractions of a micrometre. Further applications of clean rooms or ultra-clean room technology may be found in optics and laser technology, and in the case of the sintering or diffusion soldering under consideration here.

International standards define specific cleanliness requirements for the operation of controlled environments. The standards and guidelines regulate the particle concentration (for example EN ISO 14644 and VDI 2083 from 2019) or additionally the environmental microbial load (for example the EU-GPMP guidelines from 2019).

For ultra-clean rooms, as are used in microelectronics, there is a plurality of hierarchical zones with corresponding clean room classes. Thus an ultra-clean room (ISO Class 4 and above), in which work is performed with substrates, encompasses a separate zone with the necessary systems for coating and patterning.

The object of the invention is to propose a system or a method which enables an automated, in particular fully automated procedure, whereby in particular the provision of an ISO 5 clean room can be ensured.

Furthermore, it is an object of the invention to propose a system or a method with which manual checking of individual positions or individual method steps can be dispensed with.

Moreover, a foil/film transfer unit is proposed, in particular for a sintering system, in which cover foils/films can be fully automatically placed on the workpieces to be sintered and removed therefrom. The object consists in enabling automated pick up and placing of the foils/films, wherein it is intended to avoid the foils/films from adhering to one another and/or being contaminated. In soldering systems, it is preferably possible to dispense with a foil/film transfer unit.

This object is achieved by a system, a method and by a foil/film transfer unit according to the independent claims. Advantageous further developments of the invention constitute the subject matter of the subclaims.

SUMMARY OF THE INVENTION

The present invention provides a system for connecting electronic assemblies and/or for manufacturing workpieces, in particular a sintering or soldering system, comprising a plurality of modules for connecting the electronic assemblies and/or for manufacturing the workpieces.

It is proposed that at least one module is configured as a loading station and one module as an unloading station, or one module is configured as a loading and unloading station. In both cases, at least one further module is configured as a manufacturing station, and a manufacturing workpiece carrier for accommodating the electronic assemblies and/or the workpieces, which is movable in automated manner by way of a conveying unit from the loading station via the manufacturing station to the unloading station, wherein the system is configured in particular for assembly line production.

Assembly line production may for example proceed with such a system, wherein an automated and in particular fully automated procedure is enabled. Since in particular performance of the various steps in the various modules is not subject to any interruption, a clean room, in particular a clean room to ISO 5, may for example be provided. The system may therefore in particular be suitable for microelectronics, wherein the electronic assemblies and/or the workpieces may form microelectronic assemblies or workpieces. Use may primarily be intended in the production of high power electronics, and for the formation of power semiconductor contact structures with bond buffers, as described for example in DE 10 2009 022 660 B3.

The system may in particular be a sintering system or a soldering system. Low pressure sintering, as described for example in DE 3414065 A1; DE 10 2014 114 093 B4, DE 10 2004 019 567 B3 is suitable for this purpose. In this context, sintering may on the one hand relate to the production or modification of materials under high pressure and temperature, in particular below melting temperature. Materials may in particular be ceramic or metallic materials. On the other hand, sintering may be understood to mean the connection of multiple elements of a workpiece, for example an electronic unit and a heat sink or electronic components and printed circuit boards (PCBs). Thermally resistant sintered joints can be produced in this way. Such sintered joints may be an alternative to conventional soldered joints and in particular be used in power electronics. A low pressure connection method (NTV) may be preferred for this purpose which is already successfully used in the production of large-area components, for connecting the workpieces, for example IGBT modules. NTV uses pressure sintering of a layer of silver powder to form the connection. Scanning electron microscopy examinations make it clear that the powder suitable for NTV sinters spontaneously in air at ambient pressure at a temperature as low as 200° C. Under the simultaneous action of a pressure of above 20 MPa, the powder layer is compacted into a solid silver layer, which is capable of absorbing high shear stresses. In comparison with conventional connection methods, which are based on solidification of a liquid phase, in NTV the temperature at which the connected arrangement is free of mechanical stresses can be adjusted over a wide range by suitable pressure and temperature during the connection process. In particular, copper sintering in any form, for example with a copper-based sintering paste, is appropriate for a sintering system with assembly line production.

On the other hand, the system may be configured as a soldering system, in particular as a vacuum soldering system. A reflow or diffusion soldering method may be used as the soldering method. Reflow soldering denotes a soft soldering method common in electrical engineering for soldering electronic components. Pre-applied solder deposits such as solder preforms are arranged between workpieces to be soldered and are fused to produce a soldered joint.

In the diffusion soldering process, a solder is alloyed completely to yield an intermetallic phase. The melting point of the resultant phases is distinctly higher than the operating temperature of the active components. It is likewise greatly increased relative to the melting point of the solder. Furthermore, the intermetallic phases have a distinctly higher modulus of elasticity. The process is described both for the copper-tin system used in power modules and for the gold-tin system for soldering on printed circuit boards. Load cycle tests with active switching on and off of the chips have revealed that components with this connection technology achieve cycle numbers which are higher by an order of magnitude.

To provide a clean room for the sintering or soldering system, the loading station and unloading station, or a module configured as loading and unloading station, are preferably arranged within the system. The clean room therefore extends from the loading station, via the manufacturing station, to the unloading station. At least one manufacturing workpiece carrier, which can be moved in automated manner, can be arranged in this closed system.

To provide assembly line production, one or more manufacturing workpiece carriers, which are preferably of identical configuration, are arranged within the system. A manufacturing workpiece carrier may for example accommodate a plurality of identical electronic assemblies and/or workpieces. Automated movement of the manufacturing workpiece carrier or the plurality of manufacturing workpiece carriers proceeds by way of the conveying unit. Where one module is configured as a loading and unloading station, the conveying unit preferably extends at least from the loading station to the manufacturing station and back again. If the loading station and the unloading station are configured as separate modules, wherein the manufacturing station is arranged between these two modules, the conveying unit preferably extends from the loading station, via the manufacturing station, to the unloading station. In this embodiment, the manufacturing workpiece carrier is preferably guided from the unloading station back to the loading station to provide assembly line production. This may proceed for example by another conveying method or another type of conveying. In this way, the manufacturing workpiece carrier can pass through the complete system without any intervention, in particular manual intervention, from outside the system being necessary.

In automated manner means in particular that travel may proceed without manual intervention. To this end, the conveying unit may for example be configured at least in part as a type of belt conveyor and/or as a lifting unit. A further advantage of the automated, in particular fully automated, system consists in the fact that, for each module individually and for the complete system, a clean room, in particular an ISO 5 clean room, can be provided. Thus, for example, the system may in itself be of closed and/or gas-tight configuration. Likewise, individual process chambers within the system may be of closed and/or gas-tight configuration.

In one preferred embodiment, the manufacturing station may comprise at least one further module as a soldering module and/or as a sintering module. The manufacturing station may preferably comprise more than one further module, in particular a preheating module, a plasma module, a soldering module and/or a sintering module and/or a cooling module. A preheating module serves to preheat the workpieces to be connected. A plasma module may for example be used to clean the workpieces. The soldering and/or sintering module may perform connection of the workpieces, in particular a thermal joining method under a process atmosphere. The cooling module serves in defined cooling of the workpieces, such that a high flow cycle may be achieved for in-line manufacturing, i.e. assembly line production. One or more contiguous modules, optionally connectable by gas-tight airlocks, may provide a process atmosphere, in particular reduced pressure or vacuum as process atmosphere, for connection of the workpieces The further modules are preferably arranged between the loading station and the unloading station. If the loading station and the unloading station are integrated in one common module, the further modules are preferably arranged on at least one side with regard to the loading station or unloading station. The system may for example be configured as an elongate continuous system. The manufacturing workpiece carrier may preferably pass in automated manner through all the modules of the system. It is conceivable for the manufacturing workpiece carrier to be capable of passing through the system in both directions, i.e. to and fro, so resulting in a circuit. Assembly line manufacture which proceeds in automated manner may thereby particularly advantageously be provided. The to-and-fro motion may proceed at different levels within the system.

In one preferred embodiment, one module may be configured as a loading station and one module as an unloading station, wherein the loading station is arranged upstream of the manufacturing station and the unloading station downstream of the manufacturing station, and a conveying unit conveys the electronic assemblies and/or workpieces from the unloading station, in particular bypassing the manufacturing station, back to the loading station. Bypassing the manufacturing station should in particular be understood not as spatial bypassing, but rather as functional bypassing. The manufacturing station may for example be a functional working station which in particular comprises at least one closed and/or gas-tight process chamber. When the manufacturing station is bypassed, this closed process chamber may be bypassed during return of the manufacturing workpiece carrier. In this respect, the conveying unit may for example be arranged for return outside the process chamber but within an outer housing surrounding the manufacturing station. Return of the manufacturing workpiece carrier may proceed for example below or next to the at least one working station or process chamber of the manufacturing station. In particular, return proceeds within the system, wherein the manufacturing workpiece carrier preferably does not leave the system during the entire manufacturing process, in particular assembly line production. The conveying unit may be constructed according to the belt conveyor principle or the chain guide principle. For vertical conveying of a return conveying unit arranged below the working station, a lifting means may be provided on which the workpiece carriers may be displaced according to a lift principle.

As a rule, a conveying workpiece carrier may be used as a manufacturing workpiece carrier and, if so, no transfer of the components between the various workpiece carrier types is necessary and return conveying of the manufacturing workpiece carrier can be dispensed with.

In one preferred embodiment, at least one automation robot can be provided in the loading station and/or unloading station, by which robot the electronic assemblies and/or the workpieces are transferrable in automated manner from a conveying workpiece carrier and optionally placed onto the manufacturing workpiece carrier in the loading station. The electronic assemblies and/or workpieces can be fed to the system by way of the conveying workpiece carrier. Transfer from the conveying workpiece carrier onto the manufacturing workpiece carrier preferably proceeds within the loading station. This proceeds by way of an automation robot, which is preferably arranged within the loading station. In one embodiment, an automation robot may for example be provided which is configured for loading the manufacturing workpiece carrier at the loading station and for unloading of the manufacturing workpiece carrier at the unloading station. This allows transfer of the assemblies from a—typically manufacturer-specific—conveying workpiece carrier to a system-specific manufacturing workpiece carrier. The manufacturing workpiece carrier may then for example accommodate a plurality of assemblies, wherein the conveying workpiece carrier conveys just one, or a few assemblies. In this respect, assemblies of a plurality of conveying workpiece carriers may be accommodated on a manufacturing workpiece carrier. Advantageously, a suction gripper may be used for transfer purposes, which can lift the workpieces using reduced pressure and avoiding mechanical gripping forces. Furthermore, more than one automation robot may be provided within the system. In one preferred embodiment, an automation robot is arranged in the loading station, and a further automation robot in the unloading station. In this way, continuous loading or unloading of the manufacturing workpiece carrier may proceed within the system, whereby assembly line production may particularly advantageously be achieved. The specification of the conveying workpiece carrier is thus independent of the specification of the manufacturing workpiece carrier suitable for the joining process, e.g. sintering or soldering process.

Correct fabrication, in particular position and arrangement of the assemblies on the manufacturing workpiece carrier in the loading station, may be checked and archived optically by means of a camera. A camera for optical orientation in the loading and/or unloading station may also be provided for orienting a gripper arm of an automation robot/handling robot. The automation robot may take the form of a conventional industrial robot with an arm mobile around multiple axes. It may also be embodied as a single or multi-axial conveying system for conveying workpiece carrier, foils/films, covering masks etc.

A stacking magazine for manufacturing goods carriers may be provided in or in front of the loading station, this enabling population of the conveying unit with a sequential chain of manufacturing goods carriers, in particular at the start of production. Thus, a continuous process may be immediately started up, without any need to wait for the first manufacturing goods carrier to return. Thus, high unit rates can be achieved even on manufacturing power-up.

In particular at the end of a batch run, in which a number of workpiece carriers are to be joined, dummy workpieces can be placed onto the remaining empty places of the manufacturing workpiece carrier in the case of a last manufacturing workpiece carrier which cannot be completely filled with workpieces, which dummy workpieces can be put back from the manufacturing workpiece carrier to a dummy position after the joining process, in particular a sintering or diffusion soldering process.

In one preferred embodiment, a further conveying unit may be provided for accommodating the conveying workpiece carrier, which is displaceable from the loading station to the unloading station, in particular bypassing the manufacturing station, independently of the modules. This further conveying unit may for example be guided to the system in the loading station, and guided away from the system in the unloading station. The blanks or unconnected components, which may originate from external manufacturers, are in particular arranged on the conveying workpiece carrier. Bypassing the manufacturing station should be understood as already explained above. In particular, the further conveying unit may be displaceable autonomously, and in particular independently, of the conveying unit of the manufacturing workpiece carrier of the system. The conveying unit of the conveying workpiece carrier may preferably move parallel to the modules of the system.

In one preferred embodiment, the loading station may be set up to apply a process cover to the electronic assemblies and/or the workpieces, and/or the unloading station may be set up to remove the process cover from the electronic assemblies and/or the workpieces, in particular to apply and/or remove it by means of an automation robot. The process cover may be a mask or covering mask, in particular for a sintering process, which can be placed in automated manner onto the electronic assemblies and/or workpieces which are arranged on the manufacturing workpiece carrier. Application may proceed by way of an automated device or an automation robot. The process cover may here be moved or displaced to and fro between a parked position, in particular for intermediate storage of the process cover, and the position on the manufacturing workpiece carrier. The process cover may be stored on a type of storage device and displaced to the appropriate position by way of a rail. This may be computer-controlled. If a plurality of manufacturing workpiece carriers are provided within the system, in particular for continuous manufacture, a plurality of process covers are preferably arranged within the system. For example, a process cover may be continuously placed at the parked position, if the process cover previously arranged there has been removed, or placed onto the manufacturing workpiece carrier. Furthermore, a process cover may in each case be provided for a manufacturing workpiece carrier, wherein on return of the manufacturing workpiece carrier the process cover is returned with the manufacturing workpiece carrier. Prior to return from the unloading station to the loading station, the process cover may, for return conveying, be placed back onto the manufacturing workpiece carrier.

In one preferred embodiment, the loading station and/or the unloading station may comprise at least two working positions, in particular three or four working positions, wherein the manufacturing workpiece carrier is displaceable in automated manner, in particular by way of a displacement unit, from one working position to an adjacent working position. Each of the working positions may perform a different step from the other working position. In a first working position, for example, the process cover, in particular a covering mask, may be placed onto the manufacturing workpiece carrier with the electronic assemblies and/or the workpieces. After passage through the final working position, the electronic assemblies and/or the workpieces are preferably prepared in such a way on the manufacturing workpiece carrier that the latter may pass through the manufacturing station, in particular a preheating module, soldering or sintering module and cooling module. The displacement unit may be configured as a type of conveying unit, for example as a belt conveyor or conveyor belt. The displacement unit may form a type of circuit together with the conveying unit for return conveying of the manufacturing workpiece carrier, in order to provide assembly line production. If a plurality of manufacturing workpiece carriers are arranged in the system, these are preferably arranged at a constant relative spacing on the displacement unit. The working stations may be arranged sequentially and linearly one behind the other or indeed adjacent one another in a circle in the form of a rotary indexing table.

In one preferred embodiment, the loading station comprises three working positions, which are connected together by way of a displacement unit. To this end, the electronic assemblies and/or the workpieces may be placed in automated manner on a first working position by an automation robot. At least one mask may be placed in automated manner as a first process cover onto the electronic assemblies and/or onto the workpieces by way of an automation robot. Alternatively or in addition, in a second working position at least one foil/film may be placed in automated manner as a second process cover onto the mask by way of an automation robot, and in a third working position closure of the manufacturing workpiece carrier with the foil/film may proceed automatically in particular by way of a retaining frame, in particular a retaining ring. It is conceivable for a single automation robot to be provided for performing all the operations in all the working positions. Preferably, separate automation robots or other types of computer-controlled actuator devices are provided at each working position, in order to carry out the respective working steps in the working positions.

The foil/film transfer unit is used in particular when the system is a sintering system. In the case of a soldering system, it is possible to dispense with a foil/film transfer unit, and accordingly with any use whatsoever of a foil/film.

The foil/film may for example be a thermally resistant equalising foil/film, for example for temperature ranges around 250° C., for example a PTFE film, an FKM film, a silicone film, a polyurethane elastomer film, Eladur films, a PFA film, PI film or the like, such as a graphite film, an aluminium foil or the like. The foil/film may preferably serve as protection for an SMD (Surface Mounted Device). SMD components are extremely compact. Such electronic components have no leads, but rather are soldered directly to a printed circuit board by solderable lands. This technique may also be designated surface mounting. The foil/film may prevent undesired sticking of a gel pad to a component surface in the context of a sintering process.

In one preferred embodiment, the loading station and the unloading station may be mirror images of one another. As a result, the electronic assemblies and/or the workpieces in the loading station may particularly advantageously be continuously prepared for the subsequent sintering operation or soldering operation, while, in the unloading station, the auxiliary devices needed for sintering or soldering, such as a process cover or foil/film, may be continuously removed again. Since the working steps of the loading station are in particular performed in complementary manner in the unloading station, the two modules may preferably be of identical construction but configured as mirror images of or complementarily to one another.

In one preferred embodiment, the conveying unit for conveying the manufacturing workpiece carrier may comprise a lifting unit and an underfloor conveying unit, wherein the displacement path of the underfloor conveying unit is arranged within the system, in particular bypassing the manufacturing station, in particular a gas-tight process chamber, and in particular extends below a level at which loading and/or unloading of the manufacturing workpiece carrier and conveyance of the manufacturing workpiece carrier through the manufacturing station proceeds. Bypassing the manufacturing station should be understood as already explained above. The underfloor conveying unit may be used to move the manufacturing workpiece carrier parallel to the working positions of the loading station or unloading station. In this way, structural space can be saved, since return may proceed within the system. For instance, the manufacturing workpiece carrier may particularly advantageously be displaced from the loading station to the unloading station. In the unloading station, the further conveying unit may accommodate the electronic assemblies and/or the workpieces from the manufacturing workpiece carrier, before the manufacturing workpiece carrier is returned to the loading station.

In one preferred embodiment, an optical inspection unit which comprises at least one inspection camera may be provided. The at least one inspection camera may be in the loading station and/or in the unloading station, and can detect and log at least one positionally correct orientation of the assemblies and/or the workpieces in the manufacturing workpiece carrier. The inspection camera can verify the rotational position and X-Y offset of the workpieces on the manufacturing workpiece carrier. The inspection camera or a second inspection camera may moreover detect the rotational position and X-Y offset of the workpieces on a conveying workpiece carrier. The inspection camera may be provided with an illumination unit. Advantageously, the inspection camera may be arranged on a gripping arm of an automation robot, which ensures transfer of the workpieces from the conveying workpiece carrier onto the manufacturing workpiece carrier. Such optical inspection cameras may be included both in the loading station and in the unloading station. The inspection unit may record the position and appearance before and after connection of the workpieces. In addition, the inspection unit may control the automation robot. For instance, once a workpiece has been gripped by the automation robot, a position correction of the automation robot may be determined by means of a first inspection camera. With a second inspection camera, the precise position of the manufacturing workpiece carrier may be determined, such that the workpieces are placeable in the manufacturing workpiece carrier without positional offset and in precise orientation. Thus, incorrect positioning of a workpiece in the conveying goods carrier can be corrected and precise positioning in the manufacturing workpiece carrier ensured. To this end, one or more optical reference marks may be provided on the manufacturing workpiece carrier for simplified detection by the inspection means. The reference marks enable reliable and precise identification of the position, so enabling use of an inspection camera with low optical resolution or under difficult light conditions or with simple auxiliary lighting. Moreover, a lightweight inspection camera may for example be used on a gripping arm, so as to achieve an elevated displacement speed and low weight for the automation robot.

In one preferred embodiment, a foil/film transfer unit may be included with at least one, in particular two or more, foil/film transfer means, which are configured for automated application of foils/films as a process cover in the loading station. The foil/film transfer unit is configured in each case to place a foil/film onto the manufacturing workpiece carrier with the electronic assemblies and/or the workpieces and the mask. A foil/film transfer means may for example be configured with a gripper, wherein pick-up of the foil/film may proceed pneumatically and/or by vacuum. In this respect, a foil/film transfer means may be regarded as a handling unit, which is capable of picking up a foil/film, which may be present as a pre-cut foil/film piece, and place it again at a spatially different location. For example, a foil/film may be picked up by way of a vacuum nozzle arranged on the foil/film transfer means. Consequently, placing of the foil/film may proceed in automated or fully automated manner. Manual intervention is unnecessary. In this way, a clean room, in particular an ISO 5 clean room, may be provided.

In one preferred embodiment, the foil/film transfer unit may comprise at least one, in particular two, foil/film stacks, which are configured as a foil/film magazine and have a withdrawal surface for a top foil/film at the top. The foil/film stack may consequently consist of a stack of individual foils/films, which may be already precut, which may be placed continuously, in particular in a working position in the loading station, onto the manufacturing workpiece carriers passing through the working position. For this purpose, the top or bottom foil/film may be in each case be removed at the withdrawal surface, i.e. at the side at which the top or bottom foil/film of the stack is arranged. The at least one foil/film stack, in particular two foil/film stacks, may be arranged next to or in the loading station. If two foil/film stacks are present, uninterrupted assembly line production may be particularly advantageously provided. Thus, a first foil/film stack may be replenished while foils/films continue to be removed from the second foil/film stack. The foil/film transfer unit with the foil/film stack and the foil/film transfer means may preferably be arranged within the system.

Due to the foil/film stack with precut foils/films, the foil/film blank may be optimised, waste reduced and thus costs saved. Preferably, the foils/films may be adapted to the shape of the manufacturing workpiece carrier and the retaining frame, in particular they may be round, rectangular, square or hexagonal. Change of foil/film and change between the two foil/film stacks proceeds automatically, resulting in elevated cycle times and virtually no production delay or idle time. Uniformity of temperature between the foil/film stack and ambient temperature may be achieved, which is not ensured when the foil/film is withdrawn from a roll. Foil/film blanks of different thicknesses and foil/film or material types may be provided on the foil/film stack for sequential removal and easily adapted. On completion of production, foil/film dummies may also be provided, for example as plastic or metal sheets in the foil/film stack, such that no unnecessary scrap or foil/film waste arises. The thickness of the foils/films may be 1 mm or less, in particular 0.25 mm or less, preferably 0.1 mm or less, especially 0.05 mm or less, and the number of foils/films in the foil/film stack may also be precisely in line with the quantity of assemblies/components to be processed. ESD (electrostatic discharge) techniques may be used to load and unload the foil/film stack in order to prevent the foils/films from adhering to one another electrostatically.

It is conceivable in principle to remove a bottom or a top foil/film from a foil/film stack. In one preferred embodiment, the foil/film stack may have a foil/film elevator unit, which enables stepwise raising of the foil/film stack towards the top. A top foil/film of the foil/film stack may in this way be arranged substantially at a constant height. In this way, it is ensured that the foil/film transfer means may in each case reach the top foil/film of the foil/film stack, if this is moved on one and the same displacement path, in particular continuously at the same height.

The present invention further provides a foil/film transfer unit. The foil/film transfer unit is suitable in particular for an above-described system. Furthermore, the foil/film transfer unit may be used independently of the above-described system and/or be retrofitted for example in or on existing systems.

It is proposed that at least one, in particular two, foil/film transfer means and at least one, in particular two, foil/film stacks are included. The above-explained features and advantages likewise apply to the independent foil/film transfer unit.

With a foil/film transfer unit, it is in particular possible to pick up foils/films, in particular a thermally resistant equalising foil/film for example for temperature ranges around 250° C., for example a PTFE film, an FKM film, a silicone film, a PFA film, PI film, aluminium foil, graphite film or the like. The use of such foils/films has already been explained: they may be used in a sintering method as a process cover between a sintering pad or a hard punch and a component surface and/or a covering mask on the components.

In one preferred embodiment, a cleaning unit may be included for cleaning a top and/or bottom foil/film before transfer onto the electronic assemblies and/or onto the workpieces. In this way, any foil/film may be cleaned by means of the cleaning unit, for example prior to placing on a manufacturing workpiece carrier with electronic assemblies and/or workpieces. The cleaning unit may for example be arranged between a foil/film stack and the position of the manufacturing workpiece carrier.

When a foil/film is removed from the foil/film stack, these may adhere to one another, primarily due to a static charging. To avoid this, and to enable the use of different foil/film materials, the foils/films may advantageously be statically discharged. This may be achieved for example using an ionisation system, for example from Keyence Deutschland GmbH, Neu-Isenburg. Through automatic ion control using an ioniser, electrostatic charges may be rapidly and reliably neutralised irrespective of polarity. In this way, discharging bars for applying ions may be operated, with or without compressed air.

In one preferred embodiment, the foil/film stack may be configured as a foil/film magazine with a foil/film elevator unit, such that a respectively top foil/film of the foil/film stack is displaceable towards the top by upward travel, and the foil/film transfer means has a height-equalising system. It is for example possible in each case, after a given number of foils/films have been from the foil/film stack, to perform upwards displacement travel of 5 mm to 15 mm, in particular 10 mm. The foil/film elevator unit may for example be displaced 10 mm upwards after 5 to 15, in particular 10, foils/films have been withdrawn from the foil/film stack. The foil/film transfer means may use the height-equalising system to equalise deviations from the height at which the top foil/film to be withdrawn is located. In this way, the foil/film transfer means may so to speak provide a tolerance in foil/film accommodation. In particular, the tolerance regarding the height at which a top foil/film of the foil/film stack is located may be equalised.

In one preferred embodiment, a foil/film stack may contain a plurality of foils/films. In particular, a foil/film stack may contain foils/films for production over a period of for example 24 hours. Other periods of time are likewise conceivable.

In one preferred embodiment, the cleaning unit may comprise a linear cleaning unit or be configured as a contactlessly operating surface cleaning system. The linear cleaning unit may in each case push one foil/film through the cleaning system. In this case, the foil/film may for example be placed first of all with a first foil/film transfer means onto the linear cleaning unit, displaced and cleaned there, and then withdrawn from the cleaning unit again with a second foil/film transfer means.

In one preferred embodiment, the cleaning unit may be configured as a contactlessly operating surface cleaning system. In this case, contamination of three-dimensional or patterned surfaces may advantageously be eliminated. For example, contamination may be removed by a pulsing, high-turbulence air flow. In particular, using compressed air and/or vacuum and/or ionised air, in particular in this order, positive and negative charges may be introduced into the foil/film, to prevent dirt particles from adhering electrostatically to the film surface.

In one preferred embodiment, the foil/film can be electrostatically discharged in the cleaning unit by the introduction of positive and negative charges. Air may then preferably be blown under high pressure onto the foil/film to remove the impurities or particles. The particles are then in particular drawn off by suction, for example by an extraction unit. As a result, the foil/film is present in the discharged state, such that no particles can adhere due to electrostatic attraction. This method is suitable in particular for thermally resistant equalising foil/films for example for temperature ranges around 250° C., for example a PTFE film, an FKM film, a silicone film, a PFA film, PI film, aluminium foil, graphite film or similar foil/film types.

Contactless cleaning may for example proceed through pulsing compressed air from a rotary nozzle or through a flat jet nozzle. This is suitable for example for patterned components. Through ionisation, electrostatic charges may be eliminated, such that an electrostatic attraction may be eliminated. Ionisation with compressed air assistance provided by flat jet nozzles has proven particularly advantageous. An extraction duct may in particular be integrated. Such cleaning units may have a compact design for narrow working widths. These may also be used for retrofitting to existing production systems.

In one preferred embodiment, the cleaning unit may take the form of the STATIK-AIR product range from Dr. Escherich GmbH, Munich. This offers contactlessly operating surface cleaning with the elimination of electrostatic charges and removal of troublesome dust and material particles. An integrated extraction duct is provided for clean room application.

Individual foils/films, in particular thermally resistant equalising foils/films for example for temperature ranges around 250° C., for example PTFE films, FKM films, silicone films, PFA films, PI films, aluminium foils, graphite films or the like, preferably do not adhere to one another due to positive and negative charges. The foils/films may in this way be deionised, so to speak. In this way, it may be ensured that only a top foil/film is removed from a foil/film stack by the foil/film transfer means.

In one preferred embodiment, a height measurement and/or thickness measurement may be used to determine whether two foils/films have been picked up. The height or thickness measurement may for example take the form of a transparency measurement, wherein by determining the optical transparency of the captured foil/film or foils/films it is possible to determine whether just one foil/film has been picked up. Alternatively, to check for reliable singulation of the foils/films, the thickness of the foil/film may be mechanically measured in particular downstream of the cleaning station and prior to placement of the foil/film onto the manufacturing workpiece carrier or onto the assembly or the assemblies. This may be achieved for example by means of scanning peaks for example on the surface of the foil/film stack. In this way, the thickness measuring system can be used for all shapes, materials and thicknesses of the cover foils/films. In particular, both opaque and transparent foils/films may thus be checked. In this way, even with thick equalising foils/films, in other words foils/films for height equalisation such as for example silicone mats or reflective foils/films, a singulation check can be carried out.

In one preferred embodiment, a first foil/film transfer means may be configured to withdraw a top and/or bottom foil/film from the foil/film stack and insert it into the cleaning means, and a second foil/film transfer means is configured to withdraw the foil/film from the cleaning unit and place it onto the manufacturing workpiece carrier with the electronic assemblies and/or the workpieces.

The invention further relates to a method for connecting electronic assemblies and/or for manufacturing workpieces, in particular for assembly line production.

It is proposed that prefabrication of electronic assemblies and/or workpieces proceeds on a manufacturing workpiece carrier in the loading station. This proceeds as preparation for processing, in particular joining, in a manufacturing station, in particular comprising a preheating module, a soldering or sintering module as joining module and/or a cooling module.

It is proposed that the manufacturing workpiece carrier is displaced in automated manner from the loading station to at least the manufacturing station. In a further step, the manufacturing workpiece carrier is returned in automated manner to the loading station, in particular bypassing the manufacturing station. Bypassing the manufacturing station should in particular be understood not as spatial bypassing, but rather as functional bypassing. This should be understood as already explained with regard to the system. It is moreover conceivable for the manufacturing workpiece carrier to be guided not to the loading station but rather to an unloading station, after passage through the manufacturing station.

Alternatively, the conveying workpiece carrier may be used as a manufacturing workpiece carrier and, if so, no transfer of the components between the various workpiece carrier types is necessary and return conveying of the manufacturing workpiece carrier can be dispensed with.

The same features and advantages apply to the method as explained with reference to the system according to the invention. The method according to the invention enables an automated, in particular fully automated, procedure with regard to the connection of electronic assemblies and/or the manufacture of workpieces. Furthermore, it is possible to dispense with manual checking of individual method steps. In this way, a clean room, preferably an ISO 5 clean room, may be provided.

The method may be used for example to form soldered joints or sintered joints between electronic assemblies and/or workpieces. Such sintered joints may be an alternative to conventional soldered joints and in particular be used in power electronics. With regard to the sintered joints, reference should be made to the explanations relating to the system.

To provide assembly line production, the presented method may be performed continuously and repeatedly. In this way, a plurality of electronic assemblies and/or workpieces may be subjected to the method. In particular, a plurality of manufacturing workpiece carriers may be prefabricated or loaded in the loading station, preferably at identical time intervals.

As a rule, a conveying workpiece carrier may be used as the manufacturing workpiece carrier, wherein a separate conveying system for returning the manufacturing workpiece carrier to the start of the system may be dispensed with. In one preferred embodiment of the method, during prefabrication in the loading station the electronic assemblies and/or the workpieces may be transferred in automated manner from a component-specific conveying workpiece carrier to a system-specific manufacturing workpiece carrier. To this end, the conveying workpiece carrier is preferably driven into the loading station, such that transfer may take place within the loading station under controllable conditions. The same conveying workpiece carrier may then serve to pick up the electronic assemblies and/or the workpieces again once they have passed through the manufacturing station. Transfer of the electronic assemblies and/or of the workpieces from the manufacturing workpiece carrier to the conveying workpiece carrier may be carried out in an unloading station. The manufacturing workpiece carrier may accommodate components from a plurality of conveying workpiece carriers.

In one preferred embodiment of the method, after passage of the electronic assemblies and/or workpieces through the manufacturing station, in particular prior to automated return of the manufacturing workpiece carrier from the loading station to the unloading station, the electronic assemblies and/or the workpieces can be unloaded in an unloading station from the manufacturing workpiece carrier onto the conveying workpiece carrier. Preferably, manufacturing workpiece carriers, which are in each case unloaded, may arrive in the unloading station in particular at identical time intervals. The electronic assemblies and/or the workpieces may be unloaded from a manufacturing workpiece carrier onto one conveying workpiece carrier, or indeed onto a plurality of conveying workpiece carriers.

In one further preferred embodiment, the prefabrication stage may involve at least one automated application of at least one process cover, in particular placing of at least one mask and/or at least one foil/film, onto the electronic assemblies and/or the workpieces. The process cover may be a mask or covering mask, which may be placed in automated manner onto the electronic assemblies and/or workpieces which are arranged on the manufacturing workpiece carrier. Application may proceed by way of an automated device or an automation robot. The process cover may here preferably be moved or displaced to and fro between a parked position, in particular for intermediate storage of the process cover, and the position on the manufacturing workpiece carrier. Furthermore, the features stated in relation to the system likewise apply.

In one preferred embodiment of the method, in the loading station, in a first working position, a mask may be placed in automated manner, as a first process cover, onto the electronic assemblies and/or the workpieces arranged on the manufacturing workpiece carrier. Furthermore, in a second working position in the loading station a thermally resistant foil/film may be placed in automated manner onto the mask as a second process cover, in particular for a sintering process. Optionally, a further equalisation foil/film may additionally be put in place. Then, in particular at a third working position, immobilisation of the foil/film with the mask and the manufacturing workpiece carrier may proceed in automated manner, preferably with a retaining frame, in particular retaining ring. With regard to the advantages and further features, reference should be made to the explanations relating to the system.

In one preferred embodiment, in the unloading station the working positions may be arranged in reverse order and carried out in reverse order. Since the same steps are in particular carried out complementarily in the unloading station as were also carried out in the loading station, the two modules may preferably be of like construction, but mirror images of one another. The loading station may likewise simultaneously serve as an unloading station, if the manufacturing component carrier is returned together with the components to the inlet of the system after passage through the system.

In one preferred embodiment, return of the manufacturing workpiece carrier may proceed at a level which is arranged below, above or adjacent to a horizontal level at which the manufacturing workpiece carrier is arranged on loading and/or unloading and the manufacturing station is arranged. Preferably, return is achieved using a lifting unit with underfloor conveying means, wherein the manufacturing workpiece carrier is moved by way of the lifting unit vertically by a level downwards or upwards and then conveyed towards the unloading station by way of the underfloor conveying means.

In one preferred embodiment, the manufacturing workpiece carrier may be returned by a first conveying unit, and the conveying workpiece carrier may be arranged on a further conveying unit, which is displaced in particular in automated manner, wherein the first conveying unit and the further conveying unit are mutually independently displaceable, in particular bypassing the manufacturing station. Bypassing the manufacturing station is to be understood to mean bypassing as already with explained regard to the system. Furthermore, the same advantages apply as already explained with regard to the system.

In one preferred embodiment, the conveying workpiece carrier may accommodate one electronic assembly and/or one workpiece, and the manufacturing workpiece carrier may accommodate more than two, preferably more than five, in particular seven or more, especially twenty-four or more, electronic assemblies and/or workpieces. Thus, during loading and/or unloading the manufacturing workpiece carrier may pause at a position in the loading station until the conveying unit has fully loaded the manufacturing workpiece carrier with electronic assemblies and/or workpieces.

In a joining process under a process atmosphere, e.g. vacuum sintering or vacuum soldering or diffusion soldering under a process atmosphere, a process time which leads to a time delay in the assembly line production is required to build up and relieve the vacuum or process atmosphere, as needed. The delay is brought about by opening and closure of gas-tight airlocks, by build-up and relief of the process atmosphere in the process chamber(s) and the heating and cooling operations. A high rate of throughput in the remainder of the assembly line production may moreover be achieved by its being possible to bring together a large number of workpieces in one workpiece carrier, wherein a relatively time-consuming soldering or sintering method under a process atmosphere may also connect a large number of workpieces simultaneously in parallel. It is moreover possible for the conveying workpiece carrier to accommodate more than one electronic assembly and/or more than one workpiece. A manufacturing cycle time may thus be increased, in particular in the case of assembly line production. The further conveying unit may have a higher conveying speed for conveying the conveying workpiece carrier than the first conveying unit of the manufacturing workpiece carrier, in particular if a manufacturing workpiece carrier accommodates assemblies from multiple conveying workpiece carriers.

In one preferred embodiment, in the loading station a foil/film may be placed as a process cover onto the manufacturing workpiece carrier with the electronic assemblies and/or the workpieces, wherein the foil/film may either be a new foil/film or a foil/film already used in a previous pass of the method. For instance, an already used foil/film may be reused to save material. The foil/film may be returned from the unloading station to the loading station for reuse, in particular conveyed back to the loading station together with the manufacturing workpiece carrier and there reused. The foil/film may likewise be placed onto a foil/film stack directly after removal, wherein the complete foil/film stack may be returned to the loading station once it has received a given number of foils/films. This may proceed by way of a displacement unit, which preferably runs parallel to a displacement path of the manufacturing workpiece carrier between the loading station, the manufacturing station and in particular the unloading station. Preferably, already used foils/films may be cleaned by a cleaning unit prior to their next use.

In one preferred embodiment, the foil/film may be withdrawn from the foil/film stack using a foil/film transfer means and placed onto the electronic assemblies and/or the workpieces, wherein the foil/film stack is displaced upwards stepwise towards the top of the foil/film stack, such that the respectively top foil/film is reachable with the foil/film transfer means. The features and advantages already explained with regard to the system and the foil/film transfer unit according to the invention apply mutatis mutandis to the foil/film transfer means. Preferably, in the course of withdrawal it is automatically checked that just one foil/film, or a predetermined number of foils/films is being withdrawn. This may for example proceed optically by measuring the transparency of the withdrawn foil/film or of the withdrawn foil/film stack and comparing it with reference transparency values. Alternatively or in addition, the thickness of the withdrawn foil/film or of the withdrawn foil/film stack may be determined. In this way, it may be ensured that on the one hand the correct foil/film is withdrawn and on the other hand just one or a desired number of foils/films is withdrawn. The thickness of any desired types of foil/film may be reliably and rapidly measured using a high accuracy digital sensing probe. This may be used irrespective of colour and for transparent or opaque foils/films, and also in the case of corrugated or planar foils/films. Thus, for example, a measuring position may be determined at the periphery, and a foil/film stack height may be determined before and after withdrawal or the thickness of the foil/film on a reference plane. Thus, a sensing probe may for example be used with 1 μm accuracy, such as for example a Keyence GT2 digital sensing probe. When using sensing probes, high accuracy or high repeatability can be assumed. If the object for measurement must under no circumstances be scratched, gentle models or different spindle tips may be used. Long life spans of over 20 million cycles in permanent use are possible, as is automatic calculation with a plurality of sensing probes.

In one preferred embodiment, the foil/film stack may be displaced upwards by travel of 5 mm to 15 mm, in particular 10 mm, after a given number of foils/films have been withdrawn, wherein in particular the foil/film stack is displaced upwards after 5 to 10 foils/films have been withdrawn. Thus, the foil/film transfer means may purposefully grip a respectively top foil/film of the foil/film stack, even if over a period of time the foil/film stack has a different number of foils/films.

In one preferred embodiment, automated cleaning of the foil/film using a cleaning unit proceeds prior to the foil/film being placed onto the manufacturing workpiece carrier with the electronic assemblies and/or workpieces. Preferably, each foil/film may be fed to the cleaning unit prior to being placed onto the manufacturing workpiece carrier with the electronic assemblies and/or workpieces. The cleaning unit is to this end preferably located within a closed space, in particular a clean room, in which the method is carried out.

In one preferred embodiment, the foil/film can be electrostatically discharged in the cleaning unit and then contaminants can be removed by being blown off with compressed air and/or reduced pressure. The cleaning unit may for example perform contactless surface cleaning. In this case, contamination of three-dimensional or patterned surfaces may advantageously be eliminated. For example, contamination may be removed by a pulsing, high-turbulence air flow. In particular, using compressed air and/or reduced pressure down to a vacuum, and/or ionised air, in particular in this order, positive and negative charges may be introduced into the foil/film. This may advantageously assist in preventing individual foils/films from adhering to one another.

In one preferred embodiment, at least two or indeed a plurality of foil/film stacks may be arranged adjacent one another, wherein a second or a further foil/film stack is moved into a position of a first or preceding foil/film stack as soon as the first or preceding foil/film stack no longer contains any foils/films, so ensuring an uninterrupted procedure. The various foil/film stacks may also accommodate different foils/films for different workpieces, so enabling assembly line production of different workpieces for each workpiece carrier. While foils/films are being withdrawn from the first foil/film stack, the second foil/film stack may be replenished, or vice versa. One foil/film stack may for example contain foils/films which are sufficient for production or manufacture with the method over a 24 hour period. Other time periods or differently dimensioned foil/film stacks are likewise conceivable. It is also conceivable for a predetermined sequence of different foils/films to be contained in one foil/film stack in synchrony with a planned processing sequence of for example different workpieces.

In one preferred embodiment of the method, a positionally correct orientation of the assemblies and/or of the workpieces may be optically detected and logged at least in the manufacturing workpiece carrier. To this end, an inspection means may be provided which, by using at least one inspection camera, can detect an exact position and orientation of a workpiece in the manufacturing workpiece carrier and correct it in combination with an automation robot. Using the inspection means, an automation robot, which undertakes insertion or correction of the position of the workpieces in the manufacturing workpiece carrier, may be corrected. When transferring workpieces from a conveying workpiece carrier to a manufacturing workpiece carrier, a rotational orientation and precise position may be checked and corrected. This is because, when connecting workpieces, in particular sintering or diffusion soldering, precise orientation is extremely important and can be ensured and logged by the optical inspection means. To this end, one or more optical reference marks may be provided on the manufacturing workpiece carrier for simplified detection by the inspection means.

The described features and advantages likewise apply to the system according to the invention, foil/film transfer unit according to the invention and the method according to the invention. The features may in this case be combined together differently.

BRIEF DESCRIPTION OF THE DRAWINGS

Further advantages are revealed by the appended drawings and the descriptions of the drawings. The drawings show exemplary embodiments of the invention. The drawings, description and claims contain numerous features in combination. A person skilled in the art will expediently also consider the features individually and combine them into meaningful further combinations.

In the Figures:

FIG. 15a,b is a plan view of an embodiment of a manufacturing workpiece carrier with optical reference marks;

FIG. 16 is a perspective view of a combination of a manufacturing workpiece carrier with workpieces, process cover and retaining frame;

DETAILED DESCRIPTION OF THE INVENTION

In the figures, identical or similar components are indicated with identical designations.

Figure 1:
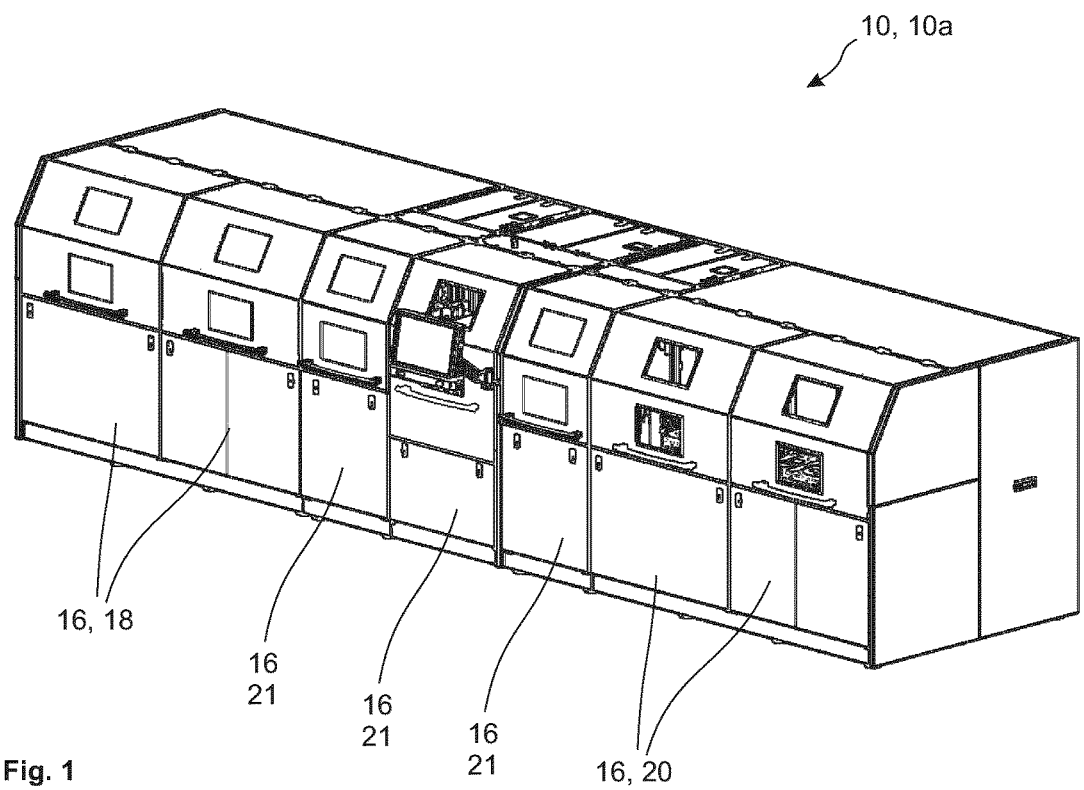
FIG. 1 shows an embodiment of a system according to the invention for connecting electronic assemblies and/or manufacturing workpieces with multiple modules.

FIG. 1 shows an embodiment of a system 10 according to the invention for connecting electronic assemblies 12 and/or workpieces 14. The system 10 has multiple modules 16. Such a system 10 may for example form a sintering or soldering system 10a. In this context, sintering, as already mentioned, may be understood to mean both the manufacture or modification of materials under high pressure and temperature, and as a joining process for connecting a plurality of elements. Using such a system 10 it is possible, for example, to produce thermally resistant sintered joints or soldered joints. In this embodiment, the system 10 has five modules 16. The first module 16 is configured as a loading station 18. This is followed by a manufacturing station 21 with for example a preheating module, a sintering module and a cooling module. The module 16 at the right-hand end of the system 10 is configured as an unloading station 20. To form a clean room, in particular an ISO 5 clean room, the system is preferably configured as a closed chamber and/or gas-tightly. The modules 16 are therefore preferably connected together, but protected from external influences in a common housing.

Figure 2:
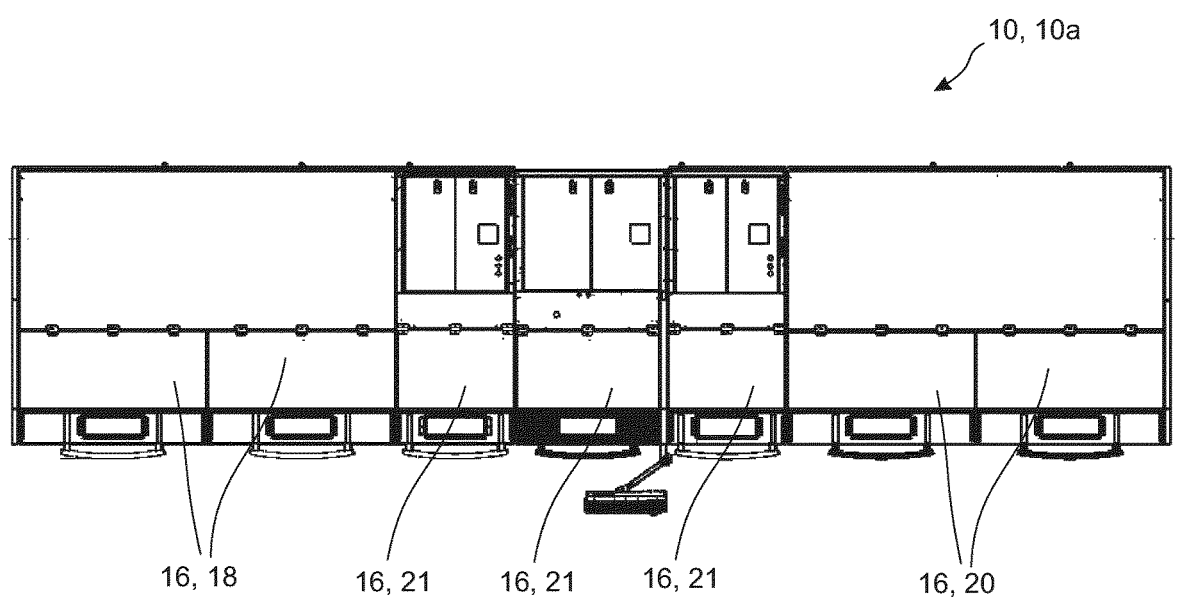
FIG. 2 is a plan view of the system of FIG. 1.

FIG. 2 is a plan view of the system 10 of FIG. 1. The individual chambers of the modules 16 are visible therein. The system 10 is overall of elongate configuration, such that a manufacturing workpiece carrier 22 with electronic assemblies 12 and/or workpieces 14 can pass in one direction, in particular in a straight line or on a rectilinear travel path, through the system 10. The electronic assemblies 12 and/or workpieces 14 may for example be fed to the system 10 from the side thereof on the left in the illustration. The electronic assemblies 12 and/or workpieces 14 can then be removed again from the system 10 on the side on the right in the illustration.

Figure 3:
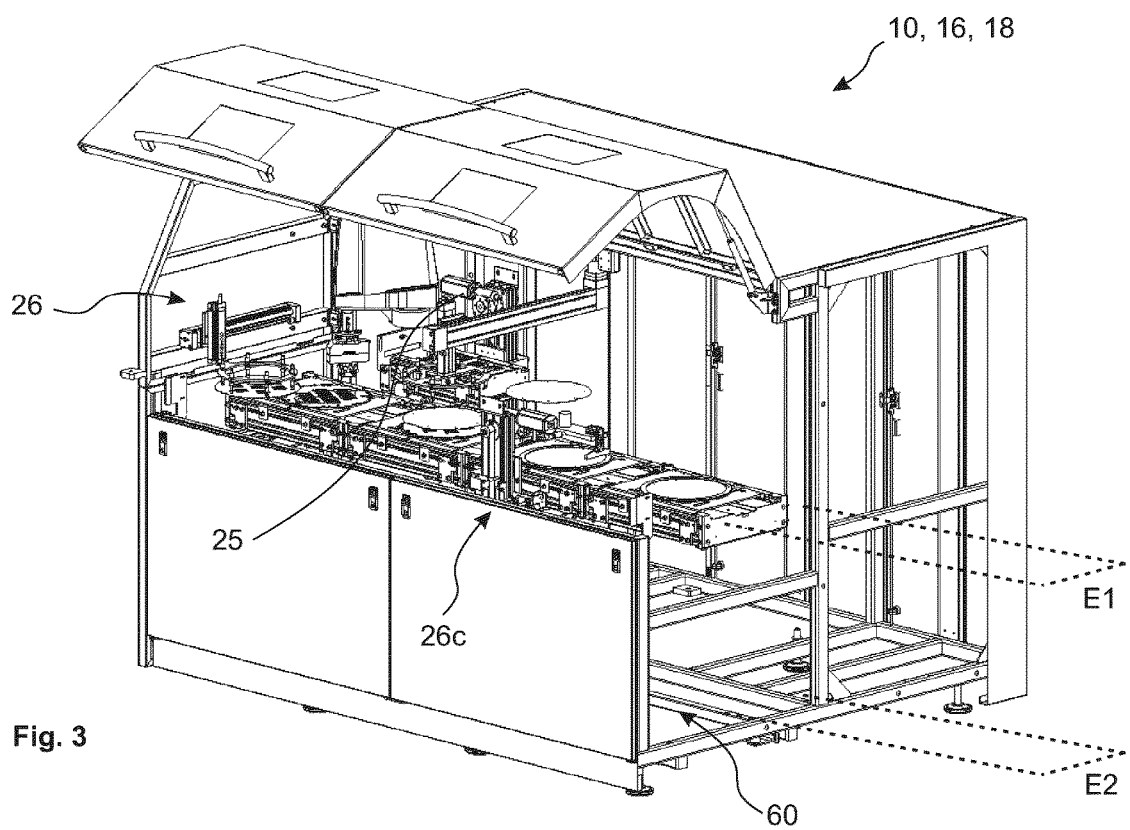
FIG. 3 shows an embodiment of a module of a system according to the invention, which is configured as a loading station.

FIG. 3 shows a module 16 of a system 10 according to the invention, which is configured as a loading station 18. The housing of the loading station 18 is shown as open at the front. This reveals individual working positions 26 of the loading station 18. These are arranged at an upper or middle level E1 within the loading station 18. Below this level E1, an underfloor conveying unit 60 of a conveying unit 24 is visible, which is arranged at a level E2. This enables the manufacturing workpiece carriers 22 to be returned. This means that the manufacturing workpiece carriers 22 pass through the working positions 26 in the opposite direction to a conveying direction of the conveying unit 24. In this illustration, a lifting unit 25 of the conveying unit 24 is visible on level E1. This is connected with the underfloor conveying unit 60. The lifting unit 25 can be used to convey the manufacturing workpiece carriers 22 from the lower level E2, at which the underfloor conveying unit 60 is arranged, to the upper level E1, at which the working positions 26 are arranged. The lifting unit 25 may convey the manufacturing workpiece carriers 22 by travel from level E1 to level E2, or vice versa. In this embodiment, the lifting unit 25 is arranged at the working position 26c. Consequently, the manufacturing workpiece carriers 22 may be guided to this working position 26c. In an embodiment deviating therefrom, the manufacturing workpiece carrier 22 may be returned by the lifting unit 25 to any desired working position 26a-26d. A closed conveying circuit of the manufacturing workpiece carrier 22 is thus provided by the manufacturing station 21.

Figure 4:
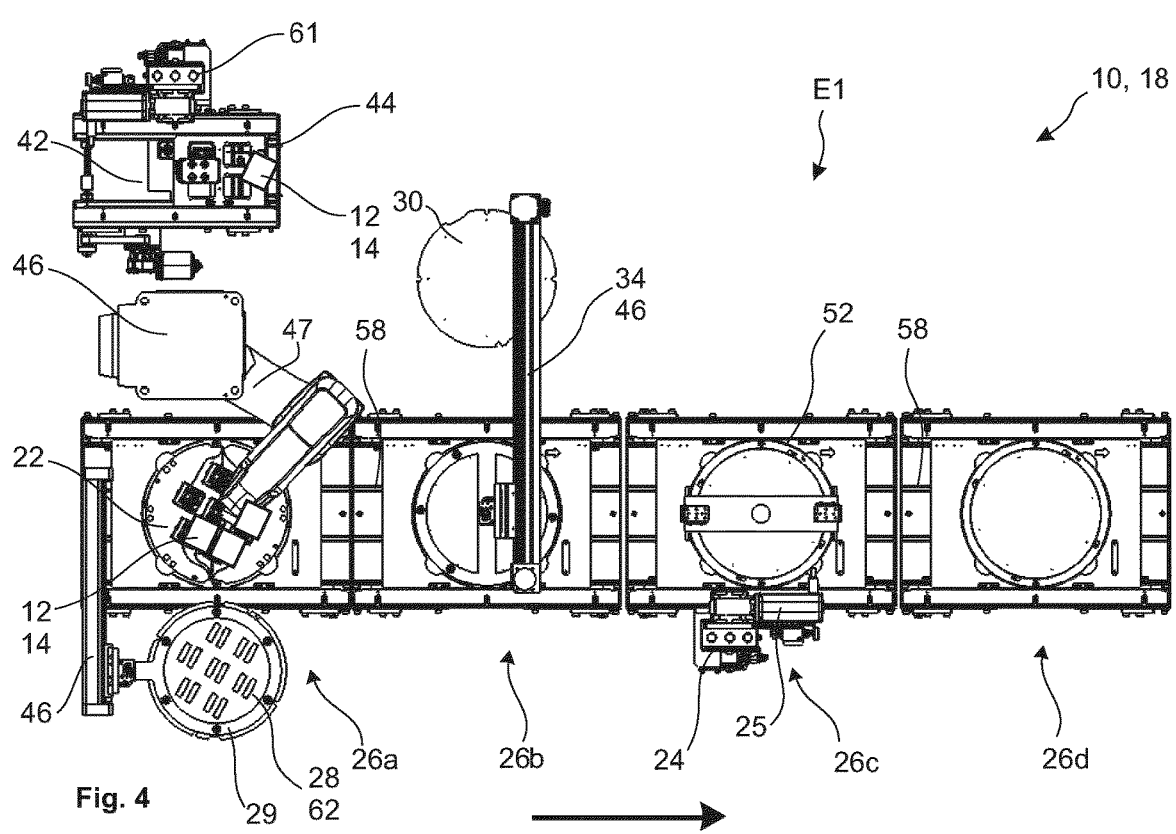
FIG. 4 is a plan view of the module of FIG. 3 showing different working positions and an embodiment of a further conveying unit.

FIG. 4 is a plan view of the loading station 18 of FIG. 3 showing different working positions 26 and with an embodiment of a second conveying unit 42. The upper level E1 is shown in plan view. It is apparent from FIGS. 3 and 4 that working positions 26a-26d are arranged at this upper level E1.

In working position 26a, the electronic assemblies 12 and/or workpieces 14 are placed from a conveying workpiece carrier 44 onto a manufacturing workpiece carrier 22. This may also be designated prefabrication with regard to the method 100. The electronic assemblies 12 and/or workpieces 14 may be transferred from the conveying workpiece carrier 44, which is located on a second conveying unit 42, onto the manufacturing workpiece carrier 22 using an automation robot 46, in particular a robot arm 47. The second conveying unit 42 may be located within the system 10, but move independently of the working positions 26 and in particular independently of the loading station 18. In this way, the second conveying unit 42 may travel in automated manner for example from the loading station 18 to an unloading station 20 (not shown in this illustration), in order there to pick up the electronic assemblies 12 and/or the workpieces 14 again. The second conveying unit 42 may pick up one or more electronic assemblies 12 and/or workpieces 14. The second conveying unit 42 comprises a lifting unit 61, by which an emptied conveying workpiece carrier 44 may be lowered from a first conveying level E1 to a second conveying level E2. Here the empty conveying workpiece carriers 44 may be displaced through the system 10 as far as the unloading station 20, bypassing atmospherically dense system modules 16, in order there to pick up workpieces 14 again from the manufacturing workpiece carriers 22. To this end, the unloading station 20 may have a further lifting unit 61, in order to raise the conveying workpiece carrier from level E2 to level E1.

Furthermore, in the working position 26a, a process cover 62, in particular a mask 28, is set in place. The process cover 62 may have openings, such that sintered joints or soldered joints may be produced in targeted manner at the positions of the openings. The process cover 62 may initially be located in a parked position 29. From this parked position 29, which is arranged next to the working position 26a, the process cover 62 may be moved in automated manner onto the manufacturing workpiece carrier 22 with the electronic assemblies 12 and/or the workpieces 14. This may proceed for example by a type of rail and a gripper or frame, which are controlled in automated manner. Positioning of the process cover 62 may likewise proceed by way of an automation robot 46. In this case, the automation robot 46 may be same one used to position the electronic assemblies 12 and/or the workpieces 14. Furthermore, a second, independent automation robot 47 (not shown) may be used. Once these steps have been carried out, the manufacturing workpiece carrier 22, with the electronic assemblies 12 and/or the workpieces 14 and with the process cover 62, is moved in automated manner to the next working position 26b. This may proceed by way of a displacement unit, for example a type of belt conveyor.

In this embodiment, a foil/film 30 is placed onto the already partly prefabricated manufacturing workpiece carrier 22 in working position 26b. The foil/film 30 can likewise be located in a type of parked position next to the working position 26b before being displaced into the working position 26b. This may likewise proceed by way of a rail with a gripper or another type of application device. Then the further prefabricated manufacturing workpiece carrier 22 with the foil/film 30 is moved in automated manner to the next working position 26c.

In working position 26c, the foil/film 30 is immobilised on the manufacturing workpiece carrier 22 by a retaining ring 52. This also proceeds in automated manner, for example by way of a computer-controlled actuator device or by way of a further automation robot 46. In working position 26c, the lifting unit 25 of the conveying unit 24 is moreover visible. The lifting unit 25 may return the manufacturing workpiece carrier 22 with applied foil/film 30 and the process cover 62 from a further module 16, for example the unloading station 20, to the loading station 18 to working position 26c. It is likewise conceivable for the manufacturing workpiece carrier 22 to be returned via the conveying unit 24 to another working position 26 (not shown here).

Working position 26d serves as a buffer position, where a further step could proceed which is needed before the prefabricated manufacturing workpiece carrier 22 is displaced in automated manner into a further module 16, in particular the manufacturing station 21.

By way of the lifting unit 25 and an underfloor conveying unit 60 (not visible in this plan view), the manufacturing workpiece carrier 22 can be displaced to a level E2 below the level shown in FIG. 4 and returned to at least one of the working positions 26a-26d.

Figure 5:
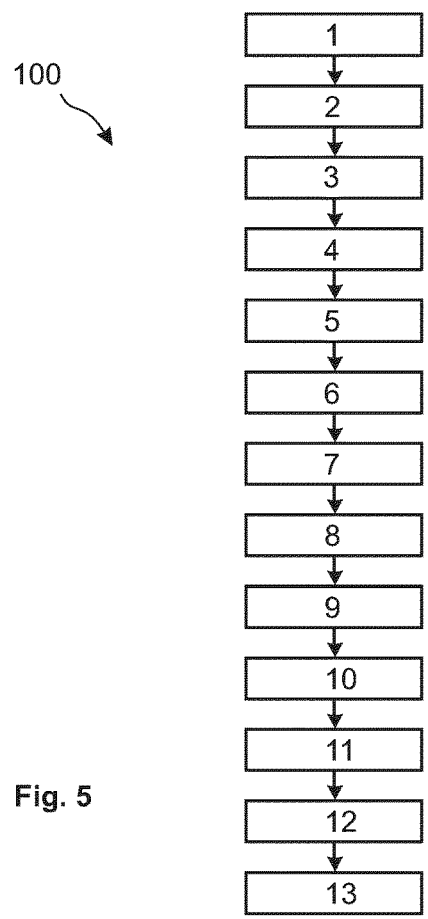
FIG. 5 shows a flow chart of possible different working steps in the loading station of FIG. 4.

FIG. 5 shows an embodiment of a possible sequence of the various working steps 1 to 13 of a method 100 in the loading station 18 of FIG. 4. In step 1, the manufacturing workpiece carrier 22 is initially fetched by way of a lifting unit 25 from the underfloor conveying unit 60 from the unloading station 20. A process cover 62 and a retaining ring 52 can be arranged on the manufacturing workpiece carrier 22 during return travel. Therefore, in step 1, the manufacturing workpiece carrier 22 may be initially guided to working position 26c. Performance of all the working steps in step 1 may take 19 seconds, for example. In step 2, the retaining ring 52 can finally be removed at working position 26c. This may take 4 seconds, for example. In step 3, the manufacturing workpiece carrier 22 can be conveyed from working position 26c to working position 26a, taking 15 seconds for example. In step 4, the process cover 62 can finally be gripped in automated manner and set down to the side in a parked position 29. This may take 4 seconds, for example. In step 5, the electronic assemblies 12 and/or the workpieces 14 may be placed into the manufacturing workpiece carrier 22 using an automation robot 46. In this case, seven electronic assemblies 12 and/or workpieces 14 may be moved every five seconds. Performance of the working steps falling under step 5 may therefore take 35 seconds, for example. In step 6, the second conveying unit 42 may travel in automated manner to an unloading station 20. This may also proceed for example under the floor, in particular taking 100 seconds, for example. In step 7, the process cover 62 can be placed back onto the manufacturing workpiece carrier 22, taking 4 seconds for example. In step 8, the manufacturing workpiece carrier 22 can be displaced from working position 26a to working position 26b, taking 7 seconds for example. In step 9, a foil/film 30, in particular a thermally resistant foil/film, may be placed onto the manufacturing workpiece carrier 22, taking 4 seconds for example. In step 10, the manufacturing workpiece carrier 22 can be moved from working position 26b to working position 26c, in particular taking 7 seconds for example. In step 11, the retaining ring 52 can be placed back onto the manufacturing workpiece carrier 22, in particular taking 4 seconds for example. In step 12, the manufacturing workpiece carrier 22 can be moved from working position 26c to working position 26d, in particular taking 7 seconds for example. Working position 26d may constitute a buffer position. In step 13, the manufacturing workpiece carrier 22 can finally be conveyed from the working position 26d into a further module 16, for example a preheating module of the manufacturing station 21. This may be carried out within a timeframe of 10 seconds, for example. The total time for performing steps 1-13 may therefore amount to 80-120 seconds for example, in particular 100-110 seconds. It goes without saying that performance may also take a different amount of time, wherein the time may be a little longer or indeed a little shorter. Preferably, the time for performing steps 6 and 13 is not added to the total, since these steps may proceed in parallel with the performance of steps 1-5 and 7-12.

Figure 6:
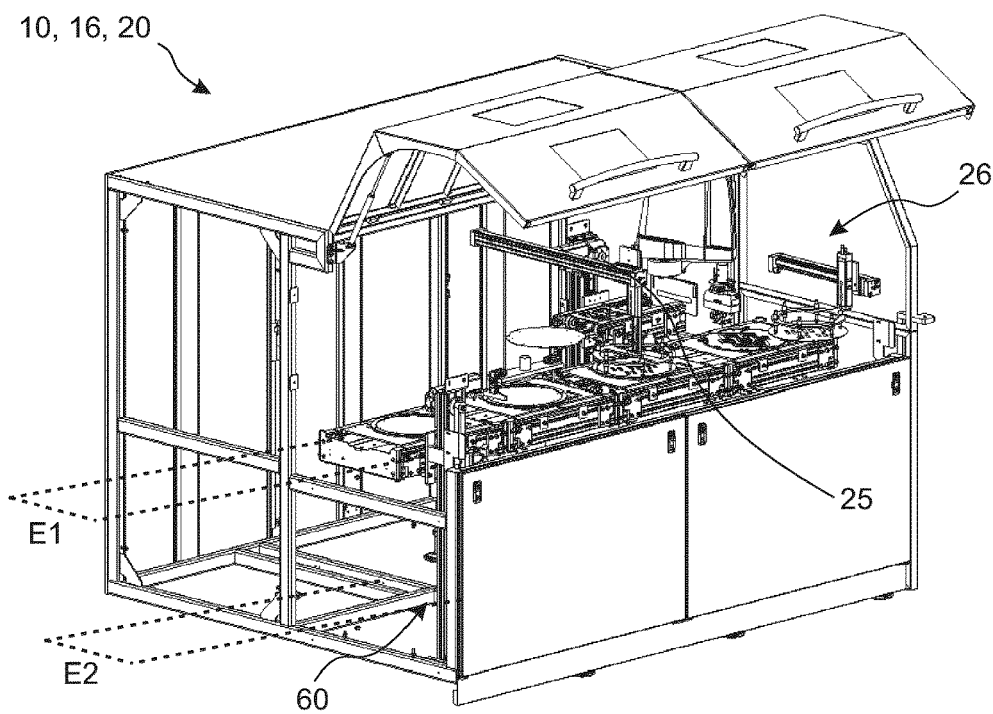
FIG. 6 shows one embodiment of a module of a system according to the invention, which is configured as an unloading station.

FIG. 6 shows a module 16 of a system 10 according to the invention, which is configured as an unloading station 20. The working positions 26 of the unloading station 20 are in arranged in reverse order to working positions 26a-26d of the loading station 18 in FIG. 3. The upper level E1 is likewise shown, in which working positions 26a-26d are arranged, as well as the lower level E2, which serves to return the manufacturing workpiece carrier 22, in particular using an underfloor conveying unit 60. The unloading station 20 may operate in a functionally complementary manner to loading station 18.

Figure 7:
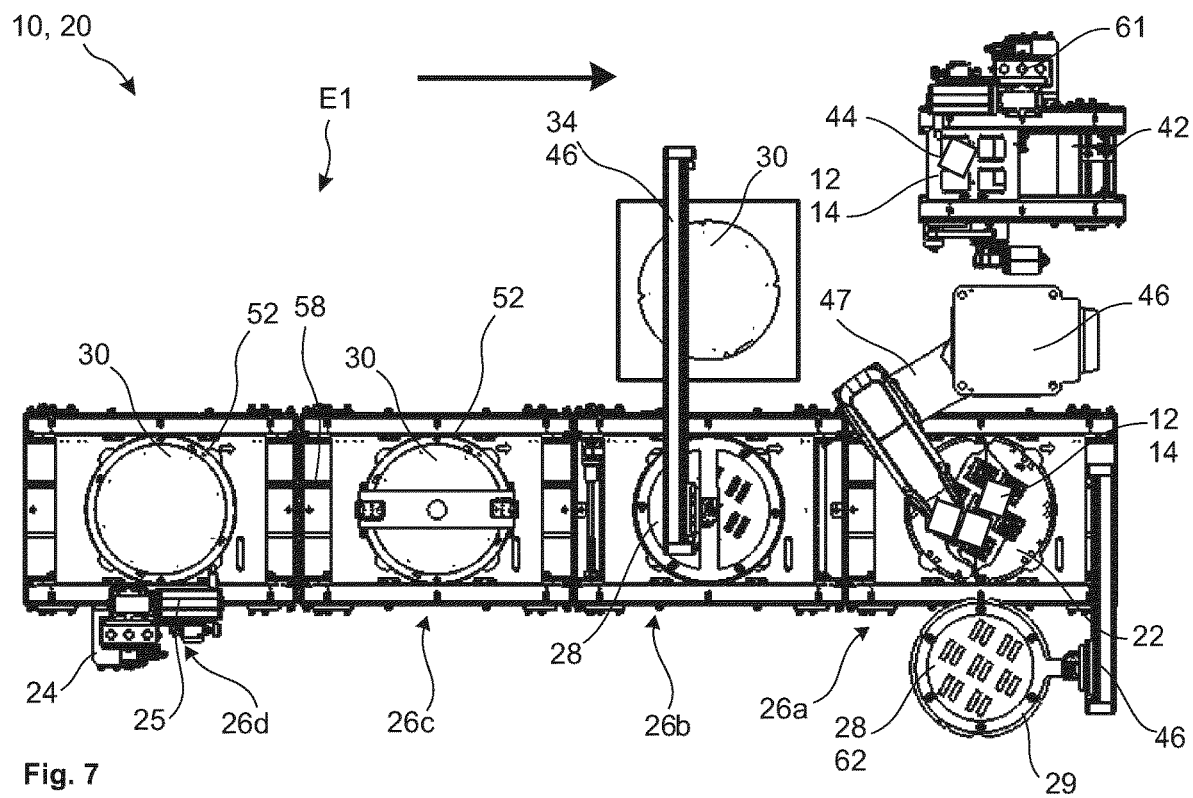
FIG. 7 is a plan view of the module of FIG. 6 showing different working positions and an embodiment of a conveying and lifting unit.

FIG. 7 is a plan view of the module 16 of FIG. 6 showing different working positions 26 at the upper level E1 and an embodiment of a second conveying unit 42. Working positions 26a-26d are in mirror image, i.e. functionally complementary, arrangement to the working positions 26a-26d in the loading station 18. Consequently, the working steps that were performed in succession in the loading station 18 can be carried out in the opposite order in the unloading station 20. A further lifting unit 61 raises empty conveying workpiece carriers, which have been conveyed from the loading station 18 to the unloading station 20, from level E2 to level E1, processed workpieces 14 being transferred thereonto from a manufacturing workpiece carrier 22 by means of the automation robot 62.

Figure 8:
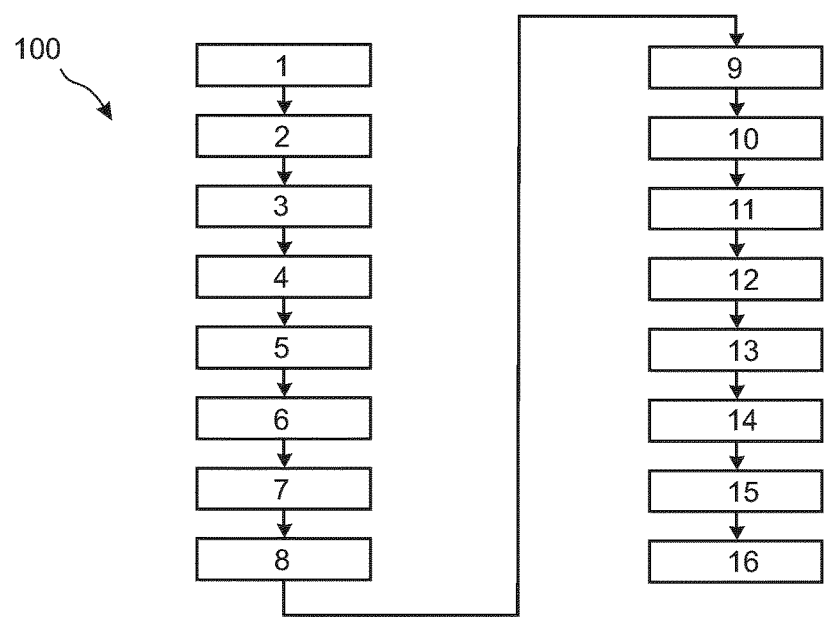
FIG. 8 shows a flow chart of possible different working steps in the unloading station of FIG. 7.

FIG. 8 shows a possible sequence of different working steps of an embodiment of a method according to the invention 100, carried out in the unloading station 20 of FIG. 7 and having steps 1 to 16. In step 1, the manufacturing workpiece carrier 22 is driven from the manufacturing station 21, in particular a module 16 configured as a cooling module, into the unloading station 20. This may proceed in automated manner, and take, for example, 10 seconds. The manufacturing workpiece carrier 22 is then located at working position 26d, which may be configured as a buffer station. In step 2, the manufacturing workpiece carrier 22 can be conveyed from working position 26d to working position 26c, taking 7 seconds for example. In step 3, the retaining ring 52 may be removed in automated manner. The retaining ring 52 may be raised, for example, which in particular requires 4 seconds. In step 4, the manufacturing workpiece carrier 22 can be displaced from working position 26c to working position 26b, taking 7 seconds for example. In step 5, the process cover 62 on the manufacturing workpiece carrier 22 may be gripped, for example by a retaining unit, which in particular takes 3 seconds. Subsequently or in parallel, in step 6 the foil/film 30, in particular the PTFE film, may be gripped and drawn off, which in particular takes 4 seconds. This may be brought about for example by a foil/film transfer means 34. In step 7, the process cover 62 can finally be released, this in particular requiring 3 seconds. In step 8, the manufacturing workpiece carrier 22 can be conveyed from working position 26b to working position 26a, in particular in automated manner and taking 7 seconds for example. In step 9, the process cover 62 may finally be gripped and set down to the side in a parked position 29, which in particular takes 4 seconds. In step 10, the electronic assemblies 12 and/or the workpieces 14 may be transferred from the manufacturing workpiece carrier 22 to a conveying workpiece carrier 44 using an automation robot 46. In this case, for example, seven electronic assemblies 12 and/or workpieces 14 may be moved every five seconds, in particular over a period of 35 seconds. In step 11, the process cover 62 may finally be placed back onto the manufacturing workpiece carrier 22. This may likewise proceed in working position 26a and take 4 seconds, for example. In step 12, the manufacturing workpiece carrier 22 may be conveyed from working position 26a to working position 26c. This may preferably proceed in automated manner and take 14 seconds, for example. In this working position 26c, in step 13 the retaining ring 52 may be placed back onto the manufacturing workpiece carrier 22, which in particular takes 4 seconds. Then in step 14, the manufacturing workpiece carrier 22 may be conveyed from working position 26c to working position 26d, which in particular takes 7 seconds. Subsequently, in step 15, the manufacturing workpiece carrier 22 may be placed onto the conveying unit 24, in particular placed by means of the lifting unit 25 onto the underfloor conveying unit 60. This may take 19 seconds, for example. In step 16, the manufacturing workpiece carrier 22 may finally be returned to the loading station 18 by way of underfloor conveying unit 60. The manufacturing workpiece carrier 22 may be returned to working position 26c of the loading station 18, at which firstly the retaining ring 52 may be removed. The subsequent method 100, in particular having steps 1-13, has already been explained on the basis of FIG. 5.

Figure 9:
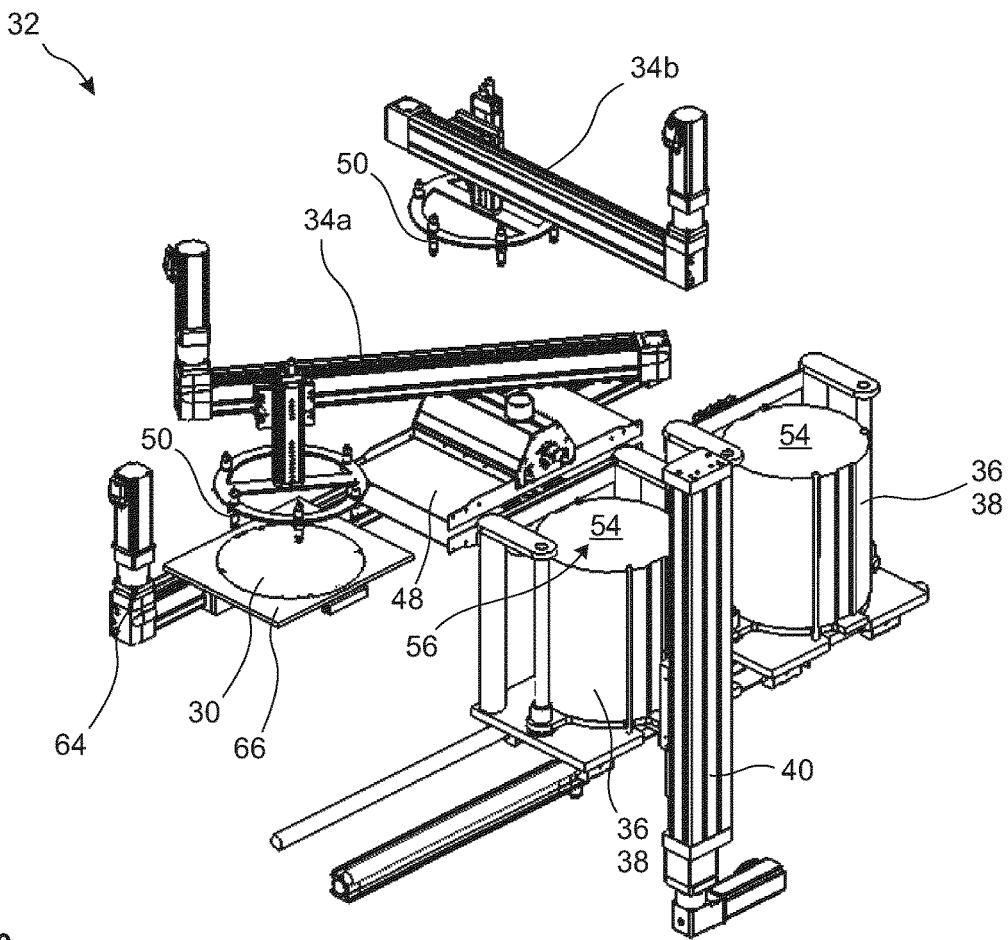
FIG. 9 shows an embodiment of a foil/film transfer unit according to the invention with two foil/film transfer means and depicts two foil/film stacks.

FIG. 9 shows an embodiment of a foil/film transfer unit 32 according to the invention with two foil/film transfer means 34 and depicts two foil/film stacks 36. Using a foil/film transfer means 34, the top foil/film 30 may in each case be removed from a top 54 of a foil/film stack 36. The top 54 serves as a withdrawal surface 56. The foil/film stacks 36 are in each case configured as a foil/film magazine 38.

If the first foil/film magazine 38 (on the left in the illustration) is empty, a second foil/film magazine 38 can be displaced to the position of the first foil/film magazine 38. The second foil/film magazine 38 may accommodate the same, but also other types of foils/films. In this way, a continuous procedure can be ensured. While foils/films 30 are being withdrawn from the second foil/film magazine 38, the first foil/film magazine 38 can be replenished. The foil/film transfer unit 32, in particular with the foil/film transfer means 34 and the foil/film magazines 38, may for example be retrofitted to any existing system. Likewise, the setting down and/or withdrawal of the foils/films 30 in the working position 26*b* of the loading station 18 and/or the unloading station 20 of the system 10 according to the invention may be performed by such a foil/film transfer unit 32.

FIG. 9 likewise shows a cleaning unit 48. One foil/film 30 is initially withdrawn from the first foil/film magazine 38 by way of the first film transfer means 34*a* and placed onto the cleaning unit 48. Once the foil/film 30 has been cleaned, the foil/film 30 is withdrawn from the cleaning unit 48 by the second foil/film transfer means 34*b* and placed onto a manufacturing workpiece carrier 22. The cleaning unit 48 may be a linear cleaning unit 64, or it may be a contactlessly operating surface cleaning system. In the case of a system 10 according to the invention or of a method 100 according to the invention, a foil/film 30 may be fed by a cleaning unit 48 in particular to working position 26*c* of the loading station 18 of FIGS. 3 and 4.

The foil/film stack 36 may be pushed vertically upwards by way of a foil/film elevator unit 40. In this way, the top foil/film 30 of the foil/film stack 36 may be located at substantially the same position whatever the situation. In this way, it is ensured that the foil/film transfer means 34*a* can reliably withdraw the top foil/film 30 of the foil/film stack 36 irrespective of the number of foils/films 30 contained in the foil/film stack 36. Furthermore, the foil/film transfer means 34 may comprise a height-equalising system 50, by which deviations in the position of the top foil/film 30 in the foil/film stack 36 may be equalised. The foil/film transfer means 34 may for example be configured with a gripper, wherein pick-up of the foil/film 30 may proceed pneumatically and/or by vacuum, in particular using a vacuum nozzle. In this way, the foil/film 30 can particularly advantageously be placed and cleaned in an automated, in particular fully automated, manner. Manual intervention for placing or withdrawal of the foil/film 30 is not necessary, whereby a clean room, in particular an ISO 5 clean room, can particularly advantageously be provided.

Figure 10:
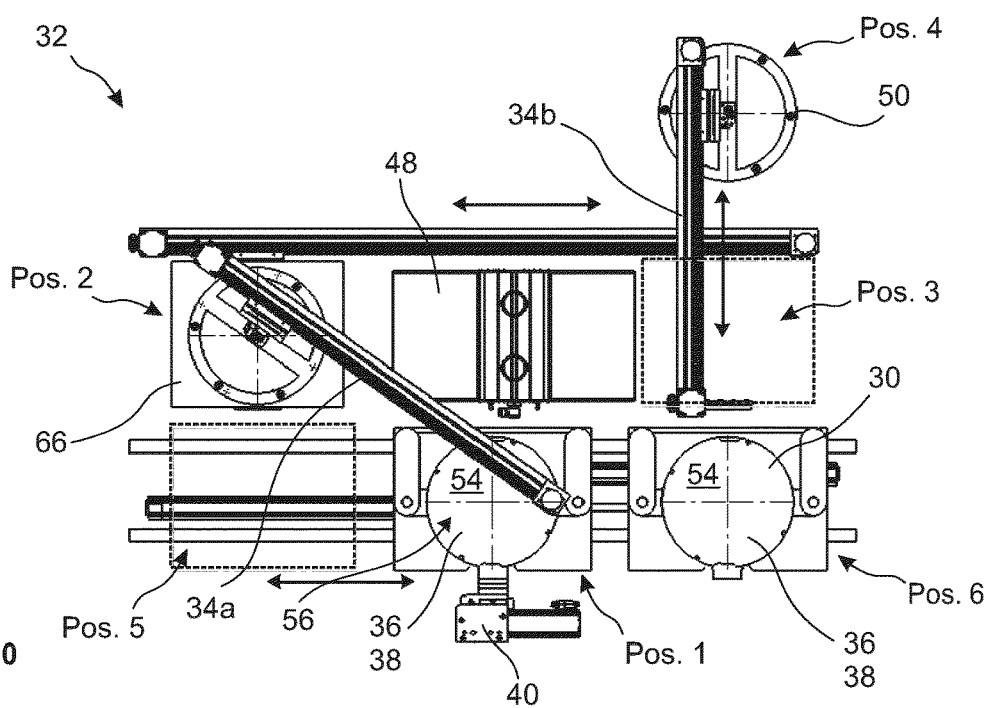
FIG. 10 is a plan view of the foil/film transfer unit of FIG. 9.

FIG. 10 is a plan view of the foil/film transfer unit 32 of FIG. 9. The same components are labelled with the same reference signs, and therefore do not need to be gone into in any more detail. This view advantageously shows that the two foil/film stacks 36 are located next to the cleaning unit 48. In the upper region of the illustration, i.e. next to the cleaning unit 48, a foil/film 30 may be placed using the foil/film transfer means 34*b* onto a manufacturing workpiece carrier 22 with electronic assemblies 12 and/or workpieces 14 (not shown in this illustration). A manufacturing workpiece carrier 22 could consequently be located next to the cleaning unit 48 in the upper region of the figure, if the latter is arranged in a loading station 18. To ensure that just one foil/film has been withdrawn and that it was the correct foil/film, at position 3 a check can be performed using a mechanical thickness measuring system, for example a high accuracy sensing probe, to determine the thickness of the withdrawn foil/film. In this way, it is possible to determine, irrespective of the type of foil/film, whether no, one or more foils/films have been withdrawn. The foil/film probe may in this case determine the film thickness at a peripheral region in order to leave the process-relevant regions (for instance for sintering) untouched.

Figure 11:
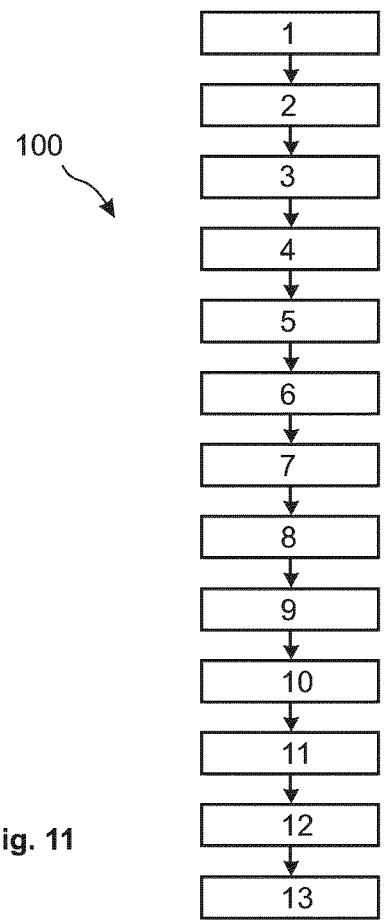
FIG. 11 shows a flow chart of possible different working steps in the foil/film transfer unit of FIG. 10.

FIG. 11 shows a possible sequence of different working steps 1 to 13 for the foil/film transfer unit 32 of FIG. 10. In step 1, individual foils/films 30 may be withdrawn from a foil/film stack 36 at position 1 and placed onto a foil/film carrier 66 at position 2. In step 2, the foil/film carrier 66 may travel with a foil/film 30 from position 2 through the cleaning unit 48 to position 3. In step 3, the foil/film 30 can finally be placed onto a manufacturing workpiece carrier 22 (not shown) located at position 4. In step 4, the foil/film carrier 66, now without a foil/film 30, can be displaced from position 3 back again to position 2. In a fifth step, steps 1-4 can be repeated. Step 6 may involve raising the foil/film stack 36 located at position 1. This may proceed using a foil/film elevator unit 40. After consumption of 10 foils/films 30, for example, or once the position of the top foil/film 30 has dropped by for example 10 mm, the foil/film elevator unit 40 may for example displace the complete foil/film stack 36 upwards by a corresponding 10 mm. A further difference in height may be equalised directly at the foil/film transfer means 34 by way of a height-equalising system 50, for example by a vacuum nozzle holder. In step 7, the foil/film stack 36 located at position 6 can be replenished or filled. The foil/film stack 36 is preferably configured as a foil/film magazine 38. Replenishing may in particular proceed during ongoing operation of the foil/film transfer unit 32, or of the system 10. In step 8, the empty foil/film magazine 38, located at position 1, may be moved to position 5. In step 9, the now replenished foil/film magazine 38, located at position 6, may be moved to position 1. In step 10, the other foil/film magazine 38, now located at position 5, may finally be replenished during ongoing operation. In step 11, a foil/film magazine 38, once again empty and located at position 1, may be moved to position 6. In step 12, the now replenished foil/film magazine 38, may be moved from position 5 to position 1. Step 13 may involve a repetition of steps 5-12. Steps 1-13 as shown may be part of the method according to the invention 100.

Figure 12:
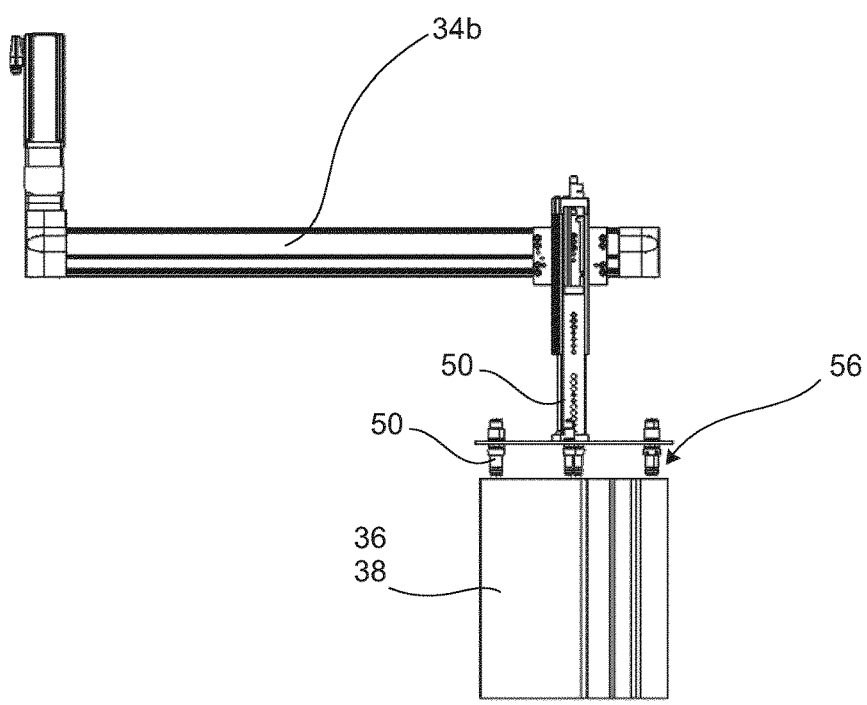
FIG. 12 shows an embodiment of a height-equalising unit of a foil/film stack and a foil/film transfer means.

FIG. 12 shows an illustration of the height-equalising system 50 of the foil/film stack 36 and of the foil/film transfer means 34. In this case it is possible, by way of the tolerance range of the foil/film transfer means 34 and the travel of the foil/film stack 36, to ensure that in each case only the top foil/film 30 on the withdrawal surface 56 of the foil/film stack 36 is picked up by the foil/film transfer means 34. In this illustration, the height-equalising system 50 is visible in the form of a vacuum nozzle holder. The vacuum nozzle holders may, for example, equalise a spring compensation of 10-30 mm, in particular 20 mm.

It goes without saying that these illustrated embodiments of the system 10, the foil/film transfer unit 32 and the method 100 may be combined with one another, such that for example different configurations of the foil/film transfer unit 32 may be combined with different configurations of the system 10, or indeed of the method 100.

Figure 13:
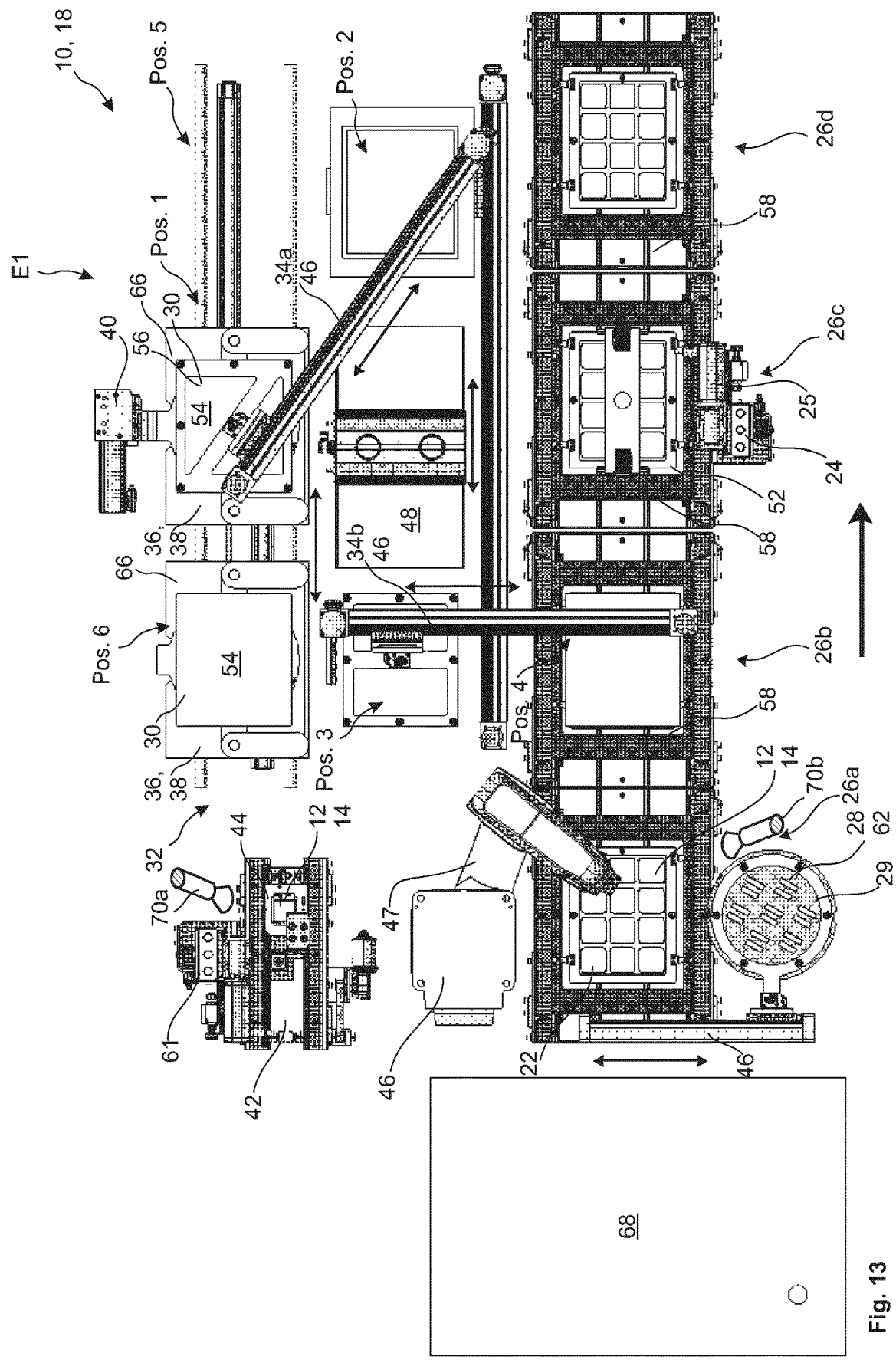
FIG. 13 is a plan view of a further embodiment of a loading station with a foil/film transfer unit and an optical inspection unit.

FIG. 13 shows a further embodiment of the loading station 18 illustrated in FIG. 4, in which a foil/film transfer unit 32 as illustrated in FIG. 10 is integrated. To avoid repetition, reference is made to the description relating to FIG. 4 and FIG. 10 in relation to the identical reference signs.

In the loading station of FIG. 13, rectangular manufacturing workpiece carriers 22 with a capacity of twelve workpieces 14 are used, onto which a covering mask 28 may be placed in working position 26*a* and a covering foil/film 30 at working position 26*b*.

At the inlet to the loading station 18, a stack magazine 68 for manufacturing workpiece carriers 22 is arranged, from which empty manufacturing workpiece carriers 22 can be taken, at least in the event of initial charging of the system 10, or stored at the end of manufacture. An automation robot 46 transfers workpieces 14 from a conveying workpiece carrier 44 to a manufacturing workpiece carrier 22 by means of a gripper arm 47, such that workpieces from twelve conveying workpiece carriers 44 can be brought together in one manufacturing workpiece carrier 22. In this respect, the system may operate in a cycle which is slower by a factor of twelve than a conventional production line.

An inspection camera 7a is arranged above the lifting unit 61, which camera detects a rotational position and X/Y positioning of the workpiece 14 on the conveying workpiece carrier 44. By means of this information, the rotary arm 47 of the automation robot 46 may pick up the workpiece 14 and set it down on the manufacturing workpiece carrier 22 in the exact rotational position and X/Y orientation. To this end, a further inspection camera 26b is oriented above the working position 26a on the manufacturing workpiece carrier 22 located there, which camera controls the precise setting down position for the automation robot 46 and ensures correct orientation of the workpieces 14 on the manufacturing workpiece carrier 22.

Figure 14:
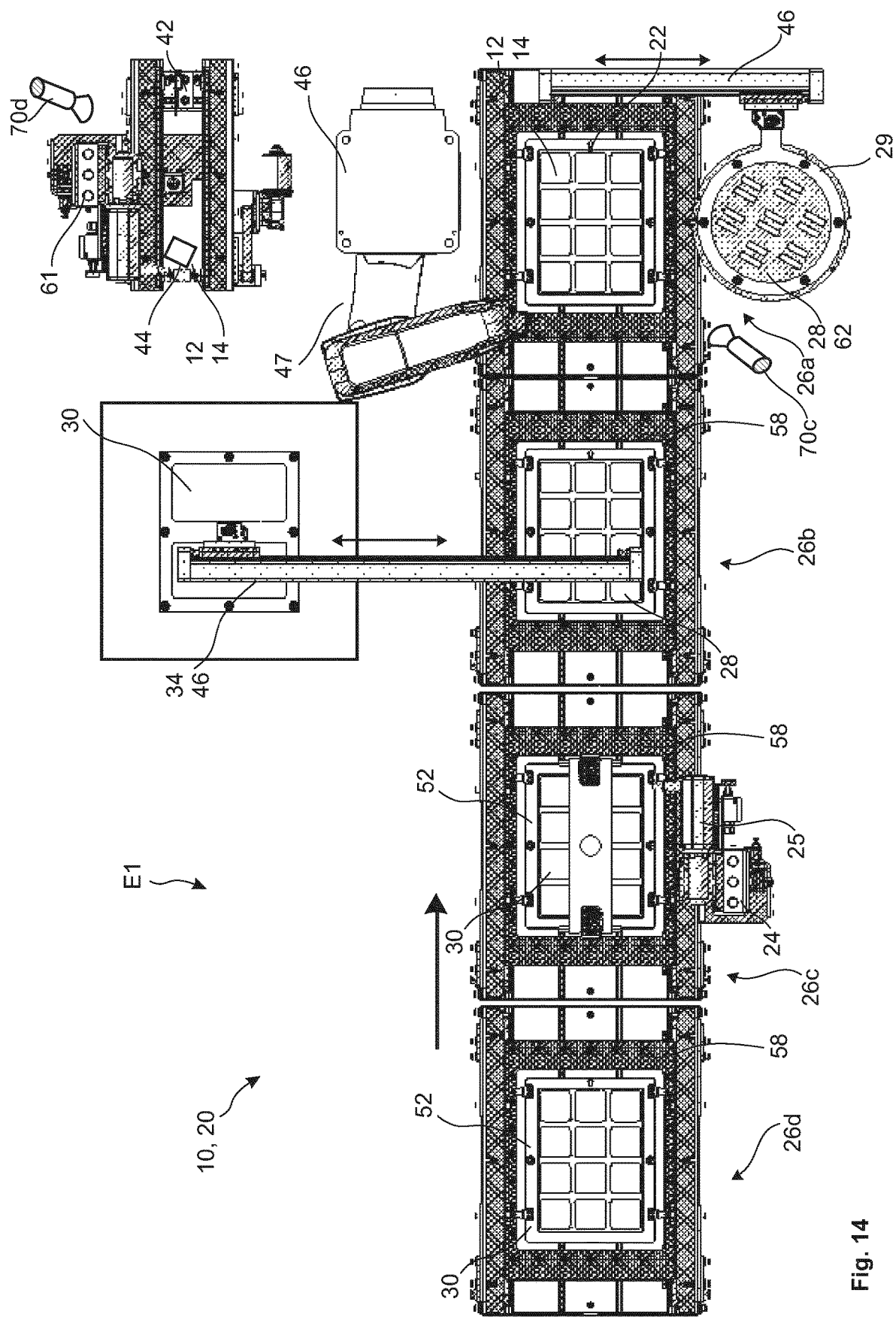
FIG. 14 shows a further embodiment of an unloading station with an optical inspection unit.

FIG. 14 illustrates the associated unloading station 20 which is complementary to the loading station 18 of FIG. 13. This also resembles as a further embodiment 20 of the unloading station 20 described in FIG. 7, and therefore reference is accordingly made to the description relating thereto. Using an inspection camera 70c above the working position 26a and a further inspection camera 70d above the lifting unit 61, an optical inspection means detects the rotational position and X/Y orientation of the workpieces 14 on the manufacturing workpiece carrier 22 and enables rotationally and positionally accurate transfer of the workpieces onto a conveying workpiece carrier 44.

FIG. 15a is a plan view onto an embodiment of an insert of a manufacturing workpiece carrier 22 with optical reference marks 72 for an optical inspection means. The insert of the manufacturing workpiece carrier 22 may accommodate seven workpieces 14 in a matrix arrangement. Fastening elements 76, for example recesses or pegs, are provided for fastening in a tablet-like frame of the manufacturing workpiece carrier 22. At the outer peripheral region of the insert, interlocking peripheral portions 74 are provided for positionally correct form-fitting insertion in the frame of the manufacturing workpiece carrier 22.

The manufacturing workpiece carrier 22 has two optical reference marks 72, which are detected by the optical inspection means and enable orientation of the manufacturing workpiece carrier even with low resolution of the inspection camera 70 or under difficult lighting conditions. The detail in FIG. 15b illustrates an optical reference mark 72. This consists of a sequence of concentric contours, in this case concentric rings. The defined spacing and widths thereof enables both exact identification of the X/Y placing, and the relative position of two reference marks 72 on the manufacturing workpiece carrier 22 relative to one another and thus determination of the rotational position of the manufacturing workpiece carrier 22.

Finally, FIG. 16 is a perspective view of a combination of a frame and of the insert, shown in FIG. 15a, of the manufacturing workpiece carrier 22 with workpieces accommodated therein. These are covered with a process cover 62 in the form of a mask 28 for a vacuum sintering method, connected by means of a retaining ring 52 to the manufacturing workpiece carrier 22. Subsequently, a foil/film 30 may also be set in place, for coverage purposes, and optionally likewise immobilised by the retaining ring 52. The foil/film 30 for example prevents a resilient sintering pad from sticking to a workpiece surface during sintering.

Figure 17:
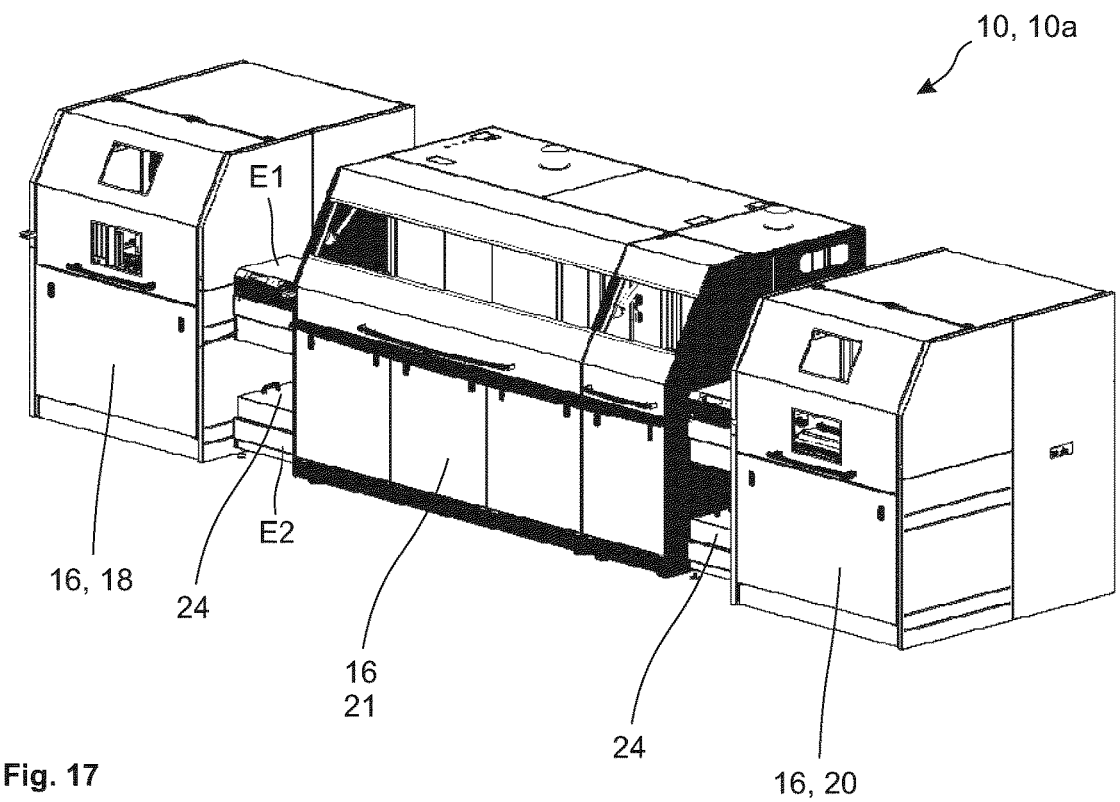
FIG. 17 shows a further embodiment of a system according to the invention for connecting electronic assemblies and/or manufacturing workpieces with multiple modules.

FIG. 17 shows a further embodiment of a system 10 according to the invention for connecting electronic assemblies 12 and/or manufacturing workpieces 14 with multiple modules. The system 10 comprises multiple modules 16. Such a system 10 may for example form a soldering system 10a. Using such a system 10 it is possible, for example, to produce thermally resistant soldered joints. In this embodiment, the system 10 has three modules 16. The first module 16 is configured as a loading station 18. This is followed by a manufacturing station 21. The module 16 at the right-hand end of the system 10 is configured as an unloading station 20. To form a clean room, in particular an ISO 5 clean room, the system is preferably configured as a closed chamber and/or gas-tightly. The modules 16 are therefore preferably connected together, but protected from external influences in a common housing. Unlike in the embodiment according to FIG. 1, the modules 16 are not connected together directly, but rather by way of a plurality of conveying units 24. At the various levels E1, E2, connections are formed in each case preferably as closed chambers and/or gas-tight units, in which the conveying units 24 extend. One of the conveying units 24 may for example form an underfloor conveying unit 60.

Figure 18:
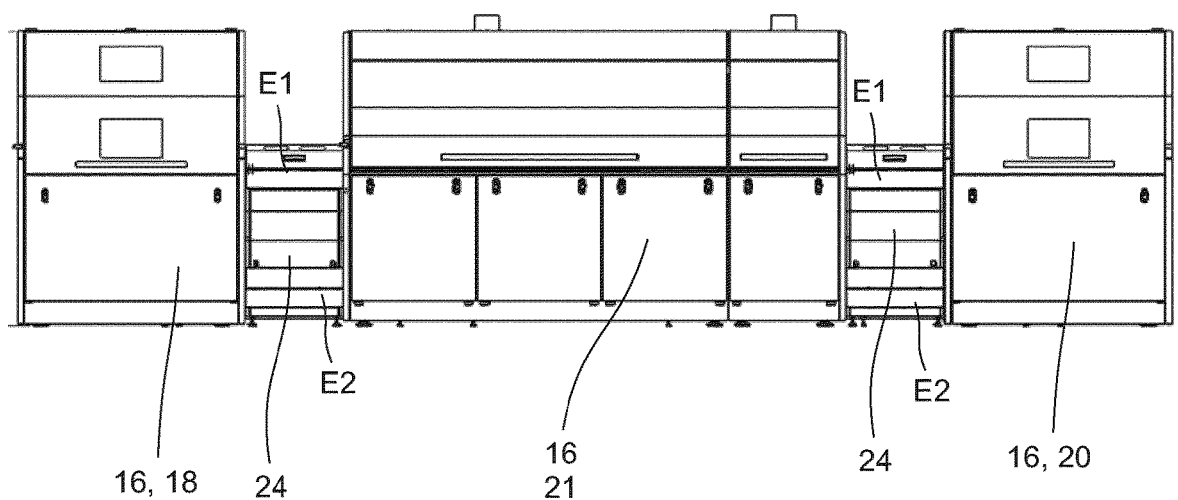
FIG. 18 is a front view of the system of FIG. 17.

FIG. 18 is a front view of the system of FIG. 17. This shows the individual connection region between the modules 16 in which the conveying units 24 extend. Unlike in the embodiment according to FIGS. 1 and 2, the embodiment according to FIGS. 17 and 18 may be configured specifically as a soldering system. The difference from a system according to FIGS. 1 and 2 resides in the fact that, in a soldering system, it is possible to dispense with the working position which is configured as a foil/film transfer unit 32 for placing foils/films. Otherwise, the embodiment according to FIGS. 17 and 18 may match that according to FIGS. 1 and 2.

Figure 19:
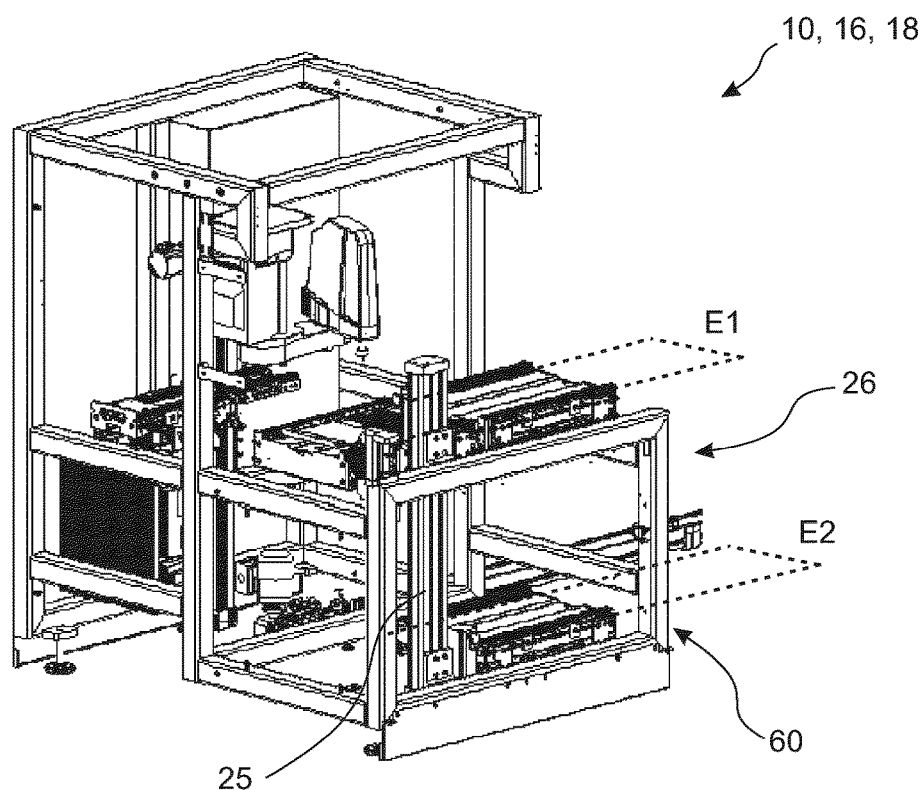
FIG. 19 shows an embodiment of a module of a system according to the invention, which is configured as a loading station.

FIG. 19 shows a further embodiment of a module 16 of a system 10 according to the invention, which is configured as a loading station 18. The loading station 18 is illustrated without a housing, whereby the interior is visible. In this illustration, a lifting unit 25 of the conveying unit 24 is visible on level E1. This is connected with the underfloor conveying unit 60, which is arranged below level E1, on level E2. The lifting unit 25 can be used to convey the manufacturing workpiece carriers 22 from the lower level E2, at which the underfloor conveying unit 60 is arranged, to the upper level E1, at which the working positions 26 are arranged. The lifting unit 25 may convey the manufacturing workpiece carriers 22 by travel from level E1 to level E2, or vice versa. This operation has already been described in detail in relation to FIG. 3. Unlike the embodiment according to FIG. 3, the embodiment according to FIG. 19 shows a loading station 18 for a soldering system according to FIGS. 17 and 18. The foil/film transfer unit can be dispensed with in such an embodiment.

Figure 20:
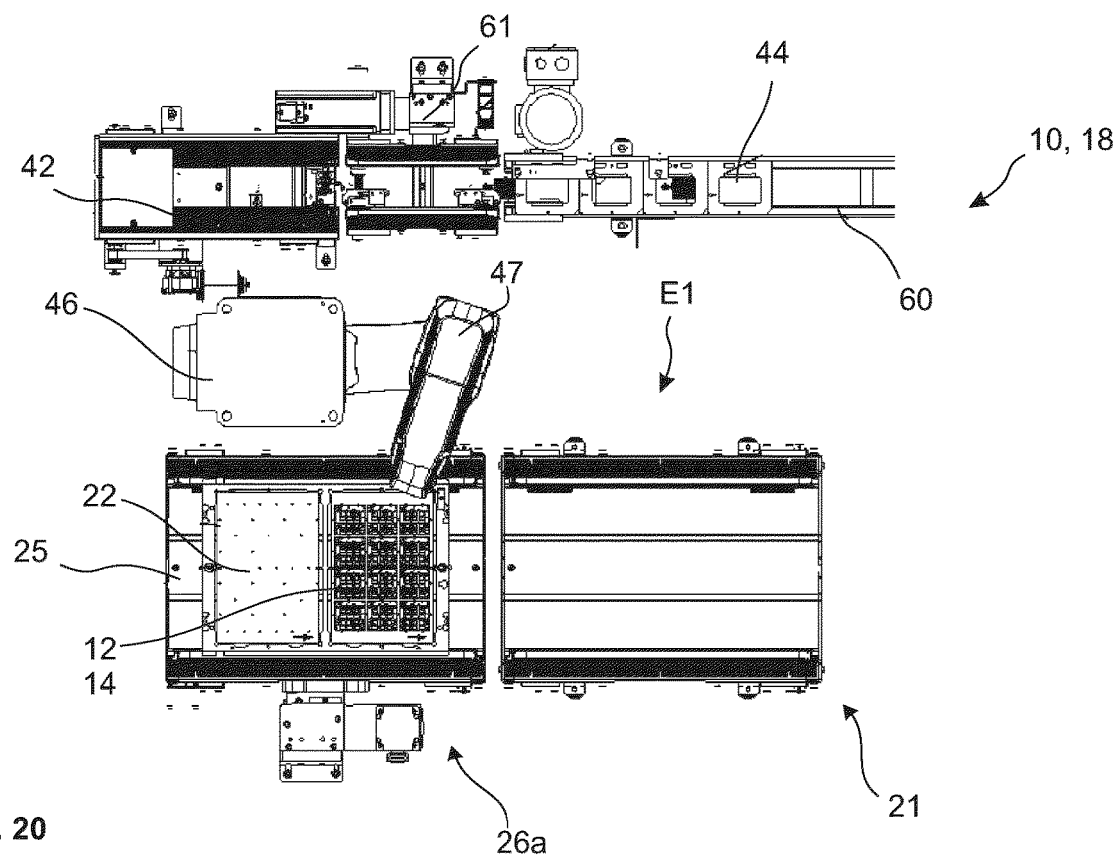
FIG. 20 is a plan view of the module of FIG. 19 showing different working positions.

FIG. 20 is a plan view of the module 16 of FIG. 19 showing different working positions. In working position 26a, the electronic assemblies 12 and/or workpieces 14 are placed onto a manufacturing workpiece carrier 22. This may also be designated prefabrication with regard to the method 100. The electronic assemblies 12 and/or workpieces 14 may be transferred using an automation robot 46, in particular a robot arm 47, onto the manufacturing workpiece carrier 22. This may also proceed by ceiling mounting. Unlike in the embodiment according to FIG. 4, the embodiment according to FIG. 20 does not have a working position 26b for placing a foil/film. The embodiment according to FIG. 20 thereby in particular shows a soldering system. After the working position 26a, a further manufacturing station 21 may be arranged, for example in the form of a conveyor belt, which serves as a buffer or buffer station. In the upper region of the figure, a second conveying unit 42 is arranged which has a lifting unit 61. At this second conveying unit 42, an underfloor conveying unit 60 is arranged on which the conveying workpiece carriers 44 are arranged. In the further embodiments, the illustration may exhibit features like those of the embodiment according to FIG. 4, with the exception of the foil/film transfer unit 32.

Figure 21:
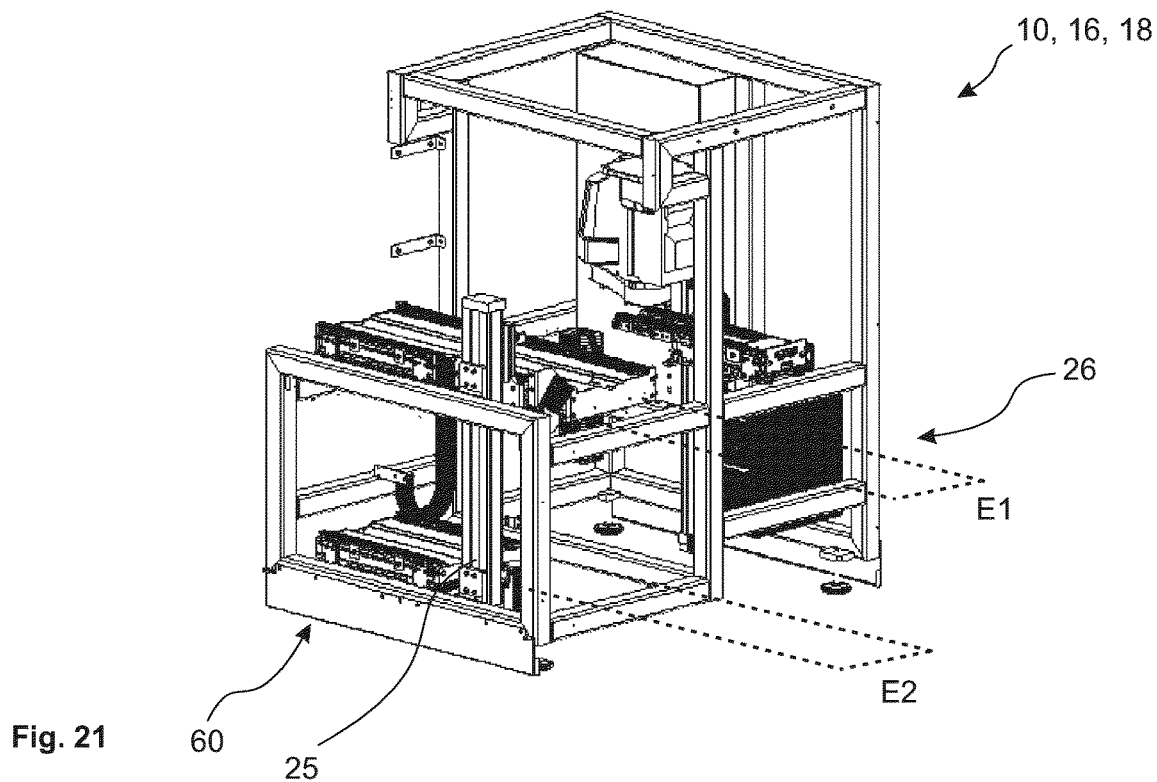
FIG. 21 shows a further embodiment of a module of a system according to the invention, which is configured as an unloading station.

FIG. 21 shows a further embodiment of a module 16 of a system 10 according to the invention, which is configured as an unloading station 20. The unloading station 20 is illustrated without a housing, whereby the interior is visible. In this illustration, a lifting unit 25 of the conveying unit 24 is visible on level E1. This is connected with the underfloor conveying unit 60, which is arranged below level E1, on level E2.

Figure 22:
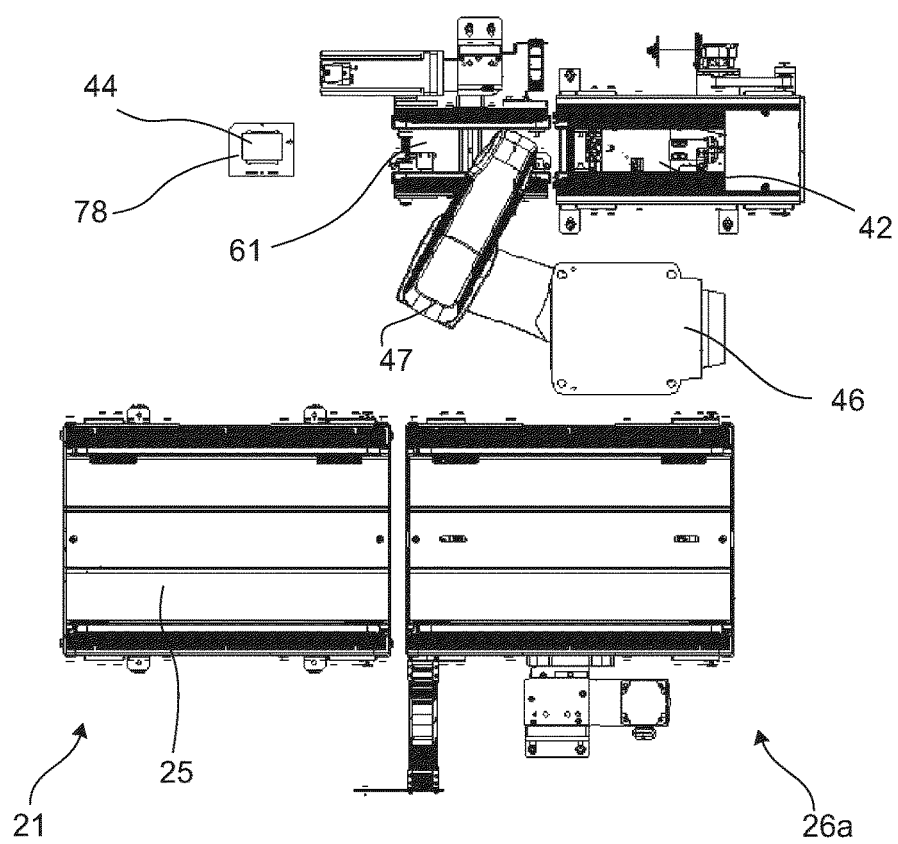
FIG. 22 is a plan view of the module of FIG. 21 showing different working positions.

FIG. 22 is a plan view of the module 16 of FIG. 21 showing the working position 26a. A further manufacturing station 21, which may for example be configured as a cooling station, is arranged upstream of the working position 26. Using the robot arm 47, the workpieces 14 can be conveyed from the working position 26a onto the second conveying unit 42. The second conveying unit 42 comprises a lifting unit 61 for conveying the conveying workpiece carrier 44. Furthermore, a magazine 78 is included, which can accommodate empty conveying workpiece carriers 44.

Figure 23:
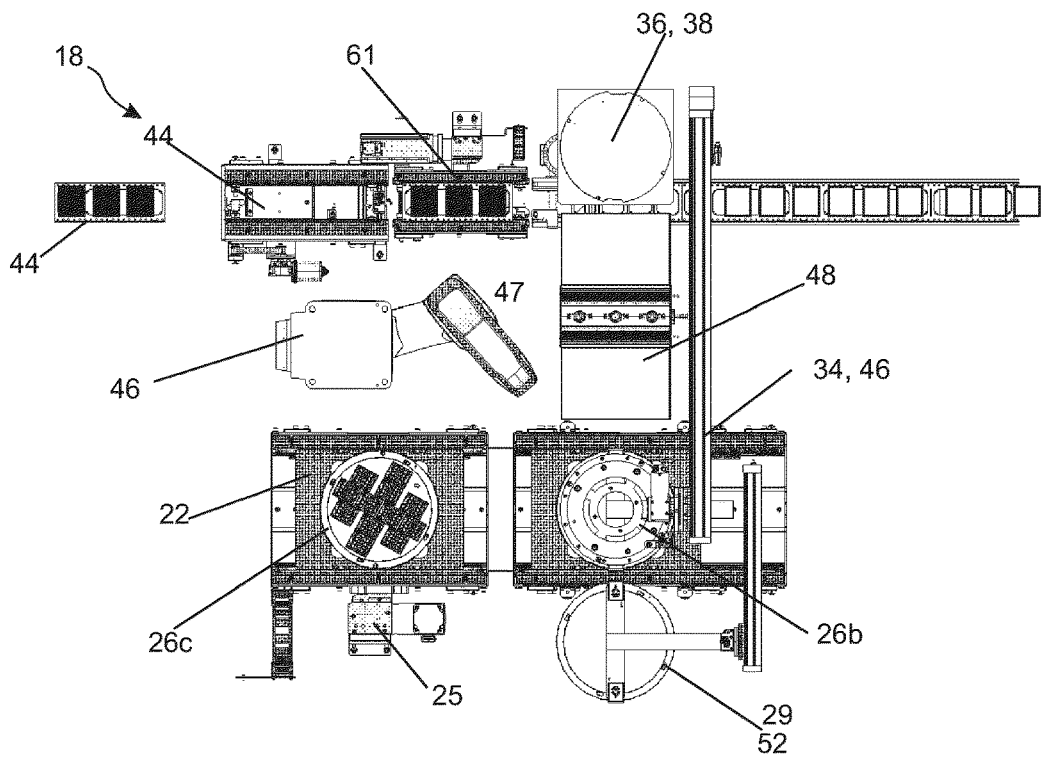
FIG. 23 shows a loading station of a further embodiment for sinter processing.
Figure 24:
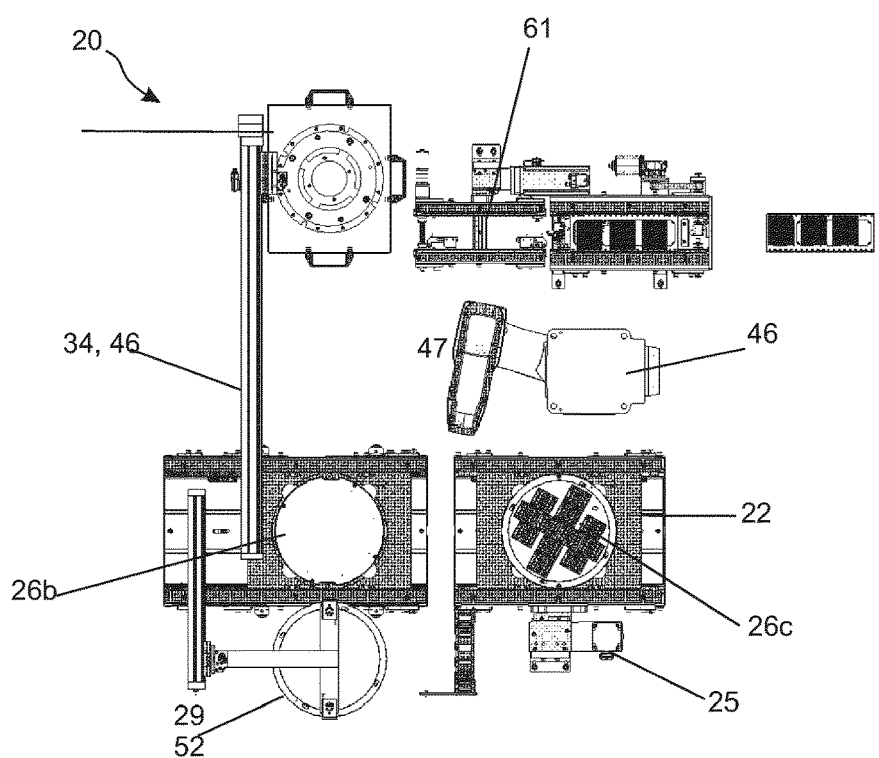
FIG. 24 shows an unloading station of a further embodiment for sinter processing.

FIGS. 23 and 24 show two further embodiments of a loading station 18 and an unloading station 20 as an add-on module 16 for a system 10. In principle, these correspond in functional procedure and structure to loading and unloading stations 18, 20 explained in detail in relation to FIGS. 13 and 14.

One possible sequence of operations for the loading station 18 in FIG. 23, when using a single top foil/film 30 for a sintered joint, is as follows:

firstly a manufacturing workpiece carrier 22 can be raised using a lifting unit 25 from an underfloor conveying unit 60 to a working level at position 26c;

after this, a plurality of workpieces 14, for example 10 to 14, in particular 12 DCB PCBs (Direct Bonded Copper Printed Circuit Boards) are transferred by the robot arm 47 of the automation robot 46 from a conveying goods carrier 44 into the manufacturing workpiece carrier 22;

after this, the populated manufacturing workpiece carrier 22 is moved from position 26c to position 26b;

the retaining ring 52, hitherto stored on the manufacturing workpiece carrier 22, can then be transferred into a parked position 29;

a foil/film 30, for example a PTFE film for sinter processing, is withdrawn as top foil/film from the foil/film stack 35 by the foil/film transfer unit 32, cleaned by the foil/film cleaning unit 48 and then applied to the populated manufacturing workpiece carrier 22;

then the retaining ring 52 from the parked position 29 is placed and fastened on the manufacturing workpiece carrier 22 to immobilise the foil/film 30;

subsequently, the workpiece carrier 22 is displaced into a preheating module for preparation for the sintering process.

Alternatively, if a bottom foil/film 30 and a top foil/film 30 are used, after the manufacturing workpiece carrier 22 has already been raised from the underfloor conveying unit 60 into position 26b after the retaining ring 29 has been brought into the parked position 52, the bottom foil/film 30 may firstly be placed onto the manufacturing workpiece carrier 22, after which population of the workpieces 14 proceeds in position 26c.

The unloading station 20 of FIG. 24, which, in terms of assembly line production, is located sequentially after the sintering module 21, may operate as a mirror image and perform the following working steps when using a top foil/film 30 for a sintered joint:

introducing a manufacturing workpiece carrier 22 from a manufacturing station 21, for example a cooling module 16, into the unloading station 20;

raising the retaining ring 52 and bringing it into a parked position 29 at position 26b of the unloading module 20;

gripping and drawing off the foil/film 30 from the populated manufacturing workpiece carrier 22 by means of a foil/film transfer means 34;

returning the retaining ring 52 from the parked position 29 onto the manufacturing workpiece carrier 22;

displacing the manufacturing workpiece carrier 22 from position 26b to position 26c;

transferring the workpieces 14 by means of the robot arm 47 from the manufacturing workpiece carrier 22 onto a conveying workpiece carrier 44, wherein each transfer operation requires less than 6 seconds, in particular 5.5 seconds;

displacing the manufacturing workpiece carrier 22 by means of the lifting unit 25 onto the underfloor conveying unit 60 for return conveying to the loading station 18.

When using a bottom foil/film 30 and a top foil/film 30, after displacement of the manufacturing workpiece carrier 22 from position 26b to position 26c, the bottom foil/film 30 can then be drawn off by an automation robot 46.

On return conveying from the loading station 20 into the unloading station 18, used foils/films can be placed onto the manufacturing workpiece carrier 22, conveyed back and placed back onto the foil/film stack 36, or placed on a further foil/film stack within the unloading station 20, which may be manually transferred back into the loading station 18 for reuse.

Once the used foil/film 30 has been removed in the unloading station 20, the or a second cleaning unit 48 may undertake cleaning of the foil/film 30 right there in the unloading station 20.

LIST OF REFERENCE NUMERALS

10 System
10a Sintering or soldering System
12 Electronic assembly
14 Workpiece
16 Module
18 Loading station
20 Unloading station
21 Manufacturing station
22 Manufacturing workpiece carrier
24 Conveying unit
25 Lifting unit
26 Working position
26a-26d Working position
28 Mask
29 Parked position
30 Foil/film
32 Foil/film transfer unit
34 Foil/film transfer means
34a, 34b Foil/film transfer means
36 Foil/film stack
38 Foil/film magazine
40 Foil/film elevator unit
42 Second conveying unit
44 Conveying workpiece carrier
46 Automation robot
47 Robot arm
48 Cleaning unit 50 Height-equalising system
52 Retaining ring
54 Top
56 Withdrawal surface
58 Displacement unit
60 Underfloor conveying unit
61 Lifting unit
62 Process cover
64 Linear unit
66 Foil/film carrier
68 Stack magazine of manufacturing workpiece carrier
70 Inspection camera
72 Optical reference mark
74 Form-fitting peripheral portion
76 Fastening element
78 Magazine
100 Method
E1 Upper level
E2 Lower level

The invention claimed is:

1. A system for connecting electronic assemblies and/or for manufacturing workpieces, in particular a sintering or soldering system, comprising:
a plurality of modules for connecting the electronic assemblies and/or for manufacturing the workpieces, wherein;
at least one module is configured as a loading station and one module as an unloading station; or
one module is configured as a loading station and unloading station;
wherein at least one further module is configured as a manufacturing station;
a manufacturing workpiece carrier for accommodating the electronic assemblies and/or the workpieces, is movable in automated manner by way of a conveying unit from the loading station via the manufacturing station to the unloading station, wherein the system is configured in particular for assembly line production;
wherein a foil/film transfer unit is included with at least one, in particular two or more foil/film transfer means, which are configured for automated application of foils/films as a process cover in the loading station.

2. The system according to claim 1, wherein the manufacturing station comprises at least one further module as a soldering module and/or as a sintering module, preferably more than one further module, in particular a preheating module, a plasma module, a soldering module, a sintering module and/or a cooling module.

3. The system according to claim 1, wherein one module is configured as a loading station and one module as an unloading station, wherein the loading station is arranged upstream of the manufacturing station and the unloading station downstream of the manufacturing station, and the conveying unit conveys the electronic assemblies and/or workpieces from the unloading station, in particular bypassing the manufacturing station, back to the loading station.

4. The system according to claim 3, wherein the loading station and the unloading station are mirror images of one another.

5. The system according to claim 1, wherein at least one automation robot is provided in the loading station and/or unloading station, by which robot the electronic assemblies and/or the workpieces are transferrable in automated manner from a conveying workpiece carrier onto the manufacturing workpiece carrier in the loading station.

6. The system according to claim 5, wherein a further conveying unit is provided for accommodating the conveying workpiece carrier, which is displaceable from the loading station to the unloading station, in particular bypassing the manufacturing station, independently of the modules.

7. The system according to claim 1, wherein the loading station is set up to apply a process cover to the electronic assemblies and/or the workpieces, and/or the unloading station is set up to remove the process cover from the electronic assemblies and/or the workpieces, in particular to apply and/or remove it by means of an automation robot.

8. The system according to claim 7, wherein the loading station comprises three working positions, which are connected together by way of a displacement unit, wherein on a first working position the electronic assemblies and/or the workpieces are placeable in automated manner by an automation robot and a mask is placeable in automated manner, as a first process cover, onto the electronic assemblies and/or the workpieces by way of an automation robot, and in a second working position a foil/film is placeable in automated manner, as a second process cover, onto the mask by way of an automation robot, and in a third working position closure of the manufacturing workpiece carrier with the foil/film proceeds in automated manner by way of a retaining ring by means of an automation robot.

9. The system according to claim 1, wherein the loading station and/or the unloading station comprises at least two working positions, in particular three or four working positions, wherein the manufacturing workpiece carrier is displaceable in automated manner, in particular by way of a displacement unit, from one working position to an adjacent working position.

10. The system according to claim 1, wherein the conveying unit for conveying the manufacturing workpiece carrier comprises a lifting unit and an underfloor conveying unit, wherein the displacement path of the underfloor conveying unit is arranged within the system, in particular bypassing the manufacturing station, and in particular extends below a level at which loading and/or unloading of the manufacturing workpiece carrier proceeds.

11. The system according to claim 1, wherein an optical inspection unit comprising at least one inspection camera is provided in the loading station and/or in the unloading station, which inspection unit can detect and log a positionally correct orientation of the assemblies and/or of the workpieces in the manufacturing workpiece carrier.

12. The system according to claim 1, wherein the foil/film transfer unit comprises at least one, in particular two, foil/film stacks, which are configured as a foil/film magazine and have a withdrawal surface for a top foil/film at the top.

13. The system according to claim 12, wherein the foil/film stack has a foil/film elevator unit, which enables stepwise raising of the foil/film stack towards the top.

14. A foil/film transfer unit for a system according claim 1, comprising:
at least one, in particular two, foil/film transfer means; and
at least one, in particular two, foil/film stacks.

15. The foil/film transfer unit according to claim 14, further comprising a cleaning unit is included for cleaning a top and/or a bottom foil/film before transfer to the electronic assemblies and/or to the workpieces.

16. The foil/film transfer unit according to claim 15, wherein the cleaning unit comprises a linear cleaning unit or is configured as a contactlessly operating surface cleaning system.

17. The foil/film transfer unit according to claim 15, wherein a first one of the foil/film transfer means is configured to withdraw a top foil/film from the foil/film stack and insert it into the cleaning means, and a second one of the foil/film transfer means is configured to withdraw the foil/film from the cleaning unit and place it onto the manufacturing workpiece carrier with the electronic assemblies and/or the workpieces.

18. The foil/film transfer unit according to claim 14, wherein the foil/film stack is configured as a foil/film magazine with a foil/film elevator unit, such that a respectively top foil/film of the foil/film stack is displaceable towards the top by upward travel, and the foil/film transfer means has a height-equalising system.

19. A method for connecting electronic assemblies and/or for manufacturing workpieces, in particular for assembly line production and preferably using a system according to claim 1, comprising;
prefabrication of electronic assemblies and/or workpieces on a manufacturing workpiece carrier in the loading station for processing in a manufacturing station, in particular comprising a preheating module, a soldering or sintering module and/or a cooling module, wherein at least one automatic application of at least one foil/film, as a process cover, proceeds onto the electronic assemblies and/or the workpieces;
automated displacement of the manufacturing workpiece carrier from the loading station to at least the manufacturing station; and
automated return of the manufacturing workpiece carrier to the loading station, in particular bypassing the manufacturing station.

20. The method according to claim 19, wherein during prefabrication in the loading station the electronic assemblies and/or the workpieces are transferred in automated manner from a conveying workpiece carrier onto the manufacturing workpiece carrier.

21. The method according to claim 20, wherein after passage of the electronic assemblies and/or the workpieces through the manufacturing station, in particular prior to automated return of the manufacturing workpiece carrier from the loading station to the unloading station, the electronic assemblies and/or the workpieces are unloaded in an unloading station from the manufacturing workpiece carrier into the conveying workpiece carrier.

22. The method according to claim 20, wherein the loading station:
in a first working position, a mask is placed in automated manner, as a first process cover, onto the electronic assemblies and/or the workpieces arranged on the manufacturing workpiece carrier;
in a second working position, at least one foil/film, in particular a thermally resistant equalising foil/film, is placed in automated manner onto the mask as a second process cover; and
and in particular in a third working position immobilisation of the foil/film with the mask and the manufacturing workpiece carrier proceeds in automated manner, preferably with a retaining ring.

23. The method according to claim 20, wherein in the unloading station the working positions are arranged in reverse order and carried out in reverse order.

24. The method according to claim 20, wherein return of the manufacturing workpiece carrier proceeds at a level which is arranged below, above or adjacent a level at which the manufacturing workpiece carrier is arranged on loading and/or unloading.

25. The method according to claim 20, wherein the manufacturing workpiece carrier is returned by a first conveying unit, and the conveying workpiece carrier is arranged on a further conveying unit, which is displaced in particular in automated manner, wherein the first conveying unit and the further conveying unit are mutually independently displaceable, in particular bypassing the manufacturing station.

26. The method according to claim 20, wherein the conveying workpiece carrier accommodates one electronic assembly and/or one workpiece, and the manufacturing workpiece carrier accommodates more than two, preferably more than five, in particular more than seven, especially twenty-four or more, electronic assemblies and/or workpieces, such that during loading and/or unloading the manufacturing workpiece carrier pauses at a position in the loading station until the conveying unit has fully loaded the manufacturing workpiece carrier with electronic assemblies and/or workpieces.

27. The method according to claim 20, wherein in the loading station, a foil/film is placed as a process cover onto the manufacturing workpiece carrier with the electronic assemblies and/or the workpieces, wherein the foil/film is either a new foil/film or a foil/film already used in a previous pass of the method.

28. The method according to claim 27, wherein the foil/film is withdrawn from the foil/film stack using a foil/film transfer means and placed onto the electronic assemblies and/or the workpieces, wherein the foil/film stack is displaced upwards stepwise towards the top of the foil/film stack, such that the respectively top foil/film is reachable with the foil/film transfer means, and wherein a check of the foil/film withdrawal is preferably undertaken.

29. The method according to claim 28, wherein at least two foil/film stacks are arranged adjacent one another, wherein a second foil/film stack is moved into a position of a first foil/film stack as soon as the first foil/film stack no longer contains any foils/films, so ensuring a continuous method.

30. The method according to claim 27, wherein the foil/film stack is displaced upwards by travel of 5 mm to 15 mm, in particular 10 mm, after a given number of foils/films have been withdrawn, wherein in particular the foil/film stack is displaced upwards after 5 to 10 foils/films have been withdrawn.

31. The method according to claim 27, wherein automated cleaning of the foil/film using a cleaning unit proceeds prior to the foil/film being placed onto the manufacturing workpiece carrier with the electronic assemblies and/or workpieces.

32. The method according to claim 31, wherein the foil/film is electrostatically discharged in the cleaning unit and then contaminants are removed by being blown off with compressed air and/or reduced pressure.

33. The method according to claim 20, wherein a positionally correct orientation of the assemblies and/or of the workpieces optically detected and logged at least in the manufacturing workpiece carrier.

* * * * *